United States Patent
Bucelot et al.

(10) Patent No.: US 9,054,682 B2
(45) Date of Patent: Jun. 9, 2015

(54) WIDE BANDWIDTH RESONANT GLOBAL CLOCK DISTRIBUTION

(71) Applicant: International Business Machines Corporation, Armonk, NY (US)

(72) Inventors: Thomas J. Bucelot, Wappingers Falls, NY (US); Alan J. Drake, Round Rock, TX (US); Robert A. Groves, Highland, NY (US); Jason D. Hibbeler, Williston, VT (US); Yong I. Kim, Austin, TX (US); Liang-Teck Pang, White Plains, NY (US); William R. Reohr, Ridgefield, CT (US); Phillip J. Restle, Katonah, NY (US); Michael G. R. Thomson, Bedford, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/759,311

(22) Filed: Feb. 5, 2013

(65) Prior Publication Data

US 2014/0218087 A1   Aug. 7, 2014

(51) Int. Cl.
*G06F 1/10* (2006.01)
*H03K 5/06* (2006.01)

(52) U.S. Cl.
CPC ... *H03K 5/06* (2013.01); *G06F 1/10* (2013.01)

(58) Field of Classification Search
CPC ............................................. G06F 1/10
USPC ............ 327/291, 292, 293, 295, 299, 304; 331/36 R, 36 L, 116 R, 116 FE, 117 R, 331/117 FE, 117 D
See application file for complete search history.

(56) References Cited

U.S. PATENT DOCUMENTS

| | | | |
|---|---|---|---|
| 5,479,129 A | 12/1995 | Fernandez et al. | |
| 6,452,247 B1 | 9/2002 | Gardner | |
| 6,686,785 B2 | 2/2004 | Liu et al. | |
| 6,882,182 B1 | 4/2005 | Conn et al. | |
| 7,015,765 B2 | 3/2006 | Shepard et al. | |

(Continued)

FOREIGN PATENT DOCUMENTS

WO   WO 2009/127848 A2   10/2009

OTHER PUBLICATIONS

U.S. Appl. No. 13/759,646.

(Continued)

*Primary Examiner* — Jung Kim
(74) *Attorney, Agent, or Firm* — Stephen R. Tkacs; Stephen J. Walder, Jr.; William J. Stock

(57) ABSTRACT

A wide bandwidth resonant clock distribution comprises a clock grid configured to distribute a clock signal to a plurality of components of an integrated circuit, a tunable sector buffer configured to receive the clock signal and provide an output to the clock grid, at least one inductor, at least one tunable resistance switch, and a capacitor network. The tunable sector buffer is programmable to set latency and slew rate of the clock signal. The inductor, tunable resistance switch, and capacitor network are connected between the clock grid and a reference voltage. The at least one tunable resistance switch is programmable to dynamically switch the at least one inductor in or out of the clock distribution to effect at least one resonant mode of operation or a non-resonant mode of operation based on a frequency of the clock signal.

20 Claims, 18 Drawing Sheets

(56) References Cited

U.S. PATENT DOCUMENTS

| | | |
|---|---|---|
| 7,082,580 B2 | 7/2006 | Zarkesh-Ha et al. |
| 7,095,265 B2 | 8/2006 | Nguyen et al. |
| 7,237,217 B2 | 6/2007 | Restle |
| 7,276,932 B2 | 10/2007 | Kuang et al. |
| 7,508,280 B2 | 3/2009 | Gabara |
| 7,571,410 B2 | 8/2009 | Restle |
| 7,863,987 B2 | 1/2011 | Kanda et al. |
| 7,880,551 B2 | 2/2011 | Chan |
| 8,022,789 B2 | 9/2011 | Rokos |
| 8,253,523 B2 * | 8/2012 | Lee .............................. 336/200 |
| 8,502,569 B2 | 8/2013 | Papaefthymiou et al. |
| 2005/0057286 A1 | 3/2005 | Shepard et al. |
| 2006/0139112 A1 | 6/2006 | Shepard et al. |
| 2011/0084736 A1 | 4/2011 | Papaefthymiou et al. |
| 2011/0084772 A1 | 4/2011 | Papaefthymiou et al. |
| 2011/0084773 A1 | 4/2011 | Papaefthymiou et al. |
| 2011/0090018 A1 | 4/2011 | Papaefthymiou et al. |
| 2011/0090019 A1 | 4/2011 | Papaefthymiou et al. |
| 2011/0140753 A1 | 6/2011 | Papaefthymiou et al. |
| 2013/0194018 A1 * | 8/2013 | Papaefthymiou et al. .... 327/291 |
| 2014/0223210 A1 | 8/2014 | Bucelot et al. |

OTHER PUBLICATIONS

U.S. Appl. No. 13/759,697.

Bucelot, Thomas et al., "Changing Resonant Clock Modes", U.S. Appl. No. 13/719,408, filed Dec. 19, 2012, 37 pages.

Putic, Mateja et al., "Panoptic DVS: A Fine-Grained Dynamic Voltage Scaling Framework for Energy Scalable CMOS Design", ICCD 2009, pp. 491-497.

Sathe, Visvesh et al., "Resonant Clock Design for a Power-efficient, High-volume x86-64 Microprocessor", IEEE International Solid-State Circuits Conference 2012, San Francisco, CA, Feb. 19-23, 2012, 3 pages.

Ziesler, Conrad H. et al., "A Resonant Clock Generator for Single-Phase Adiabatic Systems", ACM ISLPED '01, Newport Beach, CA, Aug. 6-7, 2001, 6 pages.

Notice of Allowance mailed Nov. 29, 2013 for U.S. Appl. No. 13/759,697; 12 pages.

* cited by examiner

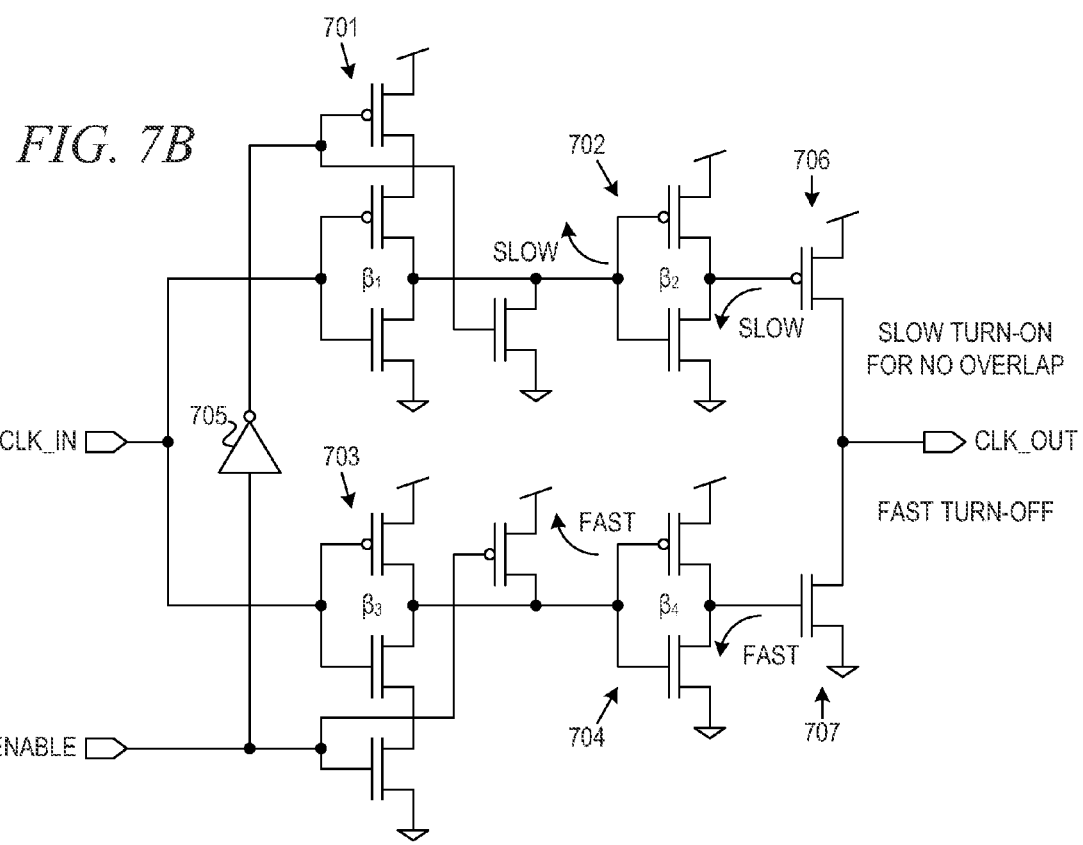

PFET TURNS OFF BEFORE
NFET TURNS ON

NFET TURNS OFF BEFORE
PFET TURNS ON

FIG. 17

```
Mode Switch Closing
000000000000000000000000000000000011111
000000000000000000000000000000000111111
000000000000000000000000000000001111111
000000000000000000000000000000011111111
000000000000000000000000000000111111111
000000000000000000000000000001111111111
000000000000000000000000000011111111111
000000000000000000000000000111111111111
000000000000000000000000001111111111111
000000000000000000000000011111111111111
000000000000000000000000111111111111111
000000000000000000000001111111111111111
000000000000000000000011111111111111111
000000000000000000000111111111111111111
000000000000000000001111111111111111111
000000000000000000011111111111111111111 step#            1 1 1 1 1 1 1 1 1 1
0 1 2 3 4 5 6 7 8 9 0 1 2 3 4 5 6 7 8 9

Sector Buffer Ramp-Down
0000000000000000000000000000000000000000
0000000000000000000000000000000000000000
0000000000000000000000000000000000000000
0000000000000000000000000000000000000000
0000000000000000000000000000000000000000
1111111110000000000000000000000000000000
1111111111111110000000000000000000000000
1111111111111111111000000000000000000000
1111111111111111111111110000000000000000
1111111111111111111111111111100000000000
1111111111111111111111111111111110000000
1111111111111111111111111111111111111000
1111111111111111111111111111111111111111
1111111111111111111111111111111111111111
1111111111111111111111111111111111111111
1111111111111111111111111111111111111111 step#            1 1 1 1 1 1 1 1 1 1
0 1 2 3 4 5 6 7 8 9 0 1 2 3 4 5 6 7 8 9
```

WIDE BANDWIDTH RESONANT GLOBAL CLOCK DISTRIBUTION

BACKGROUND

The present application relates generally to an improved data processing apparatus and method and more specifically to mechanisms for wide bandwidth resonant global clock distribution.

In a synchronous digital system, the clock signal is used to define a time reference for the movement of data within that system. The clock distribution network distributes the clock signal from a common point to all the elements that need it. Since this function is vital to the operation of a synchronous system, much attention is given to the characteristics of clock signals and the electrical networks used in their distribution. Clock signals are often regarded as simple control signals; however, these signals have some very special characteristics and attributes.

Clock signals are typically loaded with the greatest fanout and operate at the highest speeds of any signal, either control or data, within the entire synchronous system. Since the data signals are provided with a temporal reference by the clock signals, the clock waveforms must be particularly clean and sharp. Furthermore, these clock signals are particularly affected by technology scaling in that long global interconnect lines become significantly more resistive as line dimensions are decreased. This increased line resistance is one of the primary reasons for the increasing significance of clock distribution on synchronous performance. Finally, the control of any differences and uncertainty in the arrival times of the clock signals can severely limit the maximum performance of the entire system and create catastrophic race conditions in which an incorrect data signal may latch within a register.

The clock distribution network often takes a significant fraction of the power consumed by a chip. Resonant clock distribution can save up to 50% of the global clock power. Modern processors operate over a frequency range wider than the bandwidth of a resonant circuit. Also, quickly switching between resonant and non-resonant clock modes cases unacceptable changes to the clock waveform. Resonant clocking takes significant inductance; however, typical planar, spiral inductors cause too much disruption to the power supply grid and higher level routing. Resonant or other multi-mode clocking changes the required driving strength of the sector buffers resulting in changes in slew rate, changes in driver latency, and short cycles during stepping from one mode to another, especially to resonant clock mode.

Different sectors of the grid are loaded differently so a single buffer size is not optimal. Clock grid tuning is adjusted last minute, and sector loads can change requiring buffer adjustment, often after front end-of-line (FEOL), which comprises the steps taken to form transistors, anything below the metal layer.

SUMMARY

In one illustrative embodiment, a method, in a data processing system, is provided for wide bandwidth resonant clock distribution. The method comprises identifying a resonant mode for an integrated circuit based on a frequency of a clock signal for the integrated circuit. The integrated circuit comprises a plurality of components, a clock grid configured to distribute the clock signal to the plurality of components, a tunable sector buffer configured to receive the clock signal and provide an output to the clock grid, at least one inductor, at least one tunable resistance switch, and a capacitor network. The inductor, tunable resistance switch, and capacitor network are connected between the clock grid and a reference voltage. The method further comprises configuring the tunable sector buffer to set latency and slew rate of the clock signal. The method further comprises configuring the at least one tunable resistance switch to dynamically switch the at least one inductor in or out of the clock distribution to effect the identified resonant mode.

In another illustrative embodiment, a wide bandwidth resonant clock distribution comprises a clock grid configured to distribute a clock signal to a plurality of components of an integrated circuit, a tunable sector buffer configured to receive the clock signal and provide an output to the clock grid, wherein the tunable sector buffer is programmable to set latency and slew rate of the clock signal, at least one inductor, at least one tunable resistance switch, and a capacitor network. The tunable sector buffer is programmable to set latency and slew rate of the clock signal. The inductor, tunable resistance switch, and capacitor network are connected between the clock grid and a reference voltage. The at least one tunable resistance switch is programmable to dynamically switch the at least one inductor in or out of the clock distribution to effect at least one resonant mode of operation or a non-resonant mode of operation based on a frequency of the clock signal.

In another illustrative embodiment, a wide bandwidth resonant clock distribution comprises a clock grid configured to distribute a clock signal to a plurality of components of an integrated circuit and a plurality of sectors. Each sector comprises a tunable sector buffer configured to receive the clock signal and provide an output to the clock grid, at least one inductor, at least one tunable resistance switch, and a capacitor network. The tunable sector buffer is programmable to set latency and slew rate of the clock signal. The inductor, tunable resistance switch, and capacitor network are connected between the clock grid and a reference voltage. The at least one tunable resistance switch is programmable to dynamically switch the at least one inductor in or out of the clock distribution to effect at least one resonant mode of operation or a non-resonant mode of operation based on a frequency of the clock signal.

In other illustrative embodiments, a computer program product comprising a computer useable or readable medium having a computer readable program is provided. The computer readable program, when executed on a computing device, causes the computing device to perform various ones of, and combinations of, the operations outlined above with regard to the method illustrative embodiment.

In yet another illustrative embodiment, a system/apparatus is provided. The system/apparatus may comprise one or more processors and a memory coupled to the one or more processors. The memory may comprise instructions which, when executed by the one or more processors, cause the one or more processors to perform various ones of, and combinations of, the operations outlined above with regard to the method illustrative embodiment.

These and other features and advantages of the present invention will be described in, or will become apparent to those of ordinary skill in the art in view of, the following detailed description of the example embodiments of the present invention.

BRIEF DESCRIPTION OF THE SEVERAL VIEWS OF THE DRAWINGS

The invention, as well as a preferred mode of use and further objectives and advantages thereof, will best be under

FIG. 7B shows output rise slew, latency, and power control for a programmable sector buffer in accordance with an illustrative embodiment;

FIG. 17 illustrates a pattern of steps to enter resonant mode in accordance with an illustrative embodiment;

DETAILED DESCRIPTION

The illustrative embodiments provide a mechanism for wide bandwidth resonant global clock distribution. The illustrative embodiments use multiple inductors in parallel that can be dynamically switched to adjust the resonant frequency of the clock grid according to current processor frequency. This pushes the non-resonant mode to a low-power frequency where the added power caused by the inductor switches can be tolerated. The illustrative embodiments provide a switch that has a variable resistance that turns on slowly. The additional capacitance of the bias node is introduced slowly at the clock distribution so that sudden load changes do not affect the clock signal. Each inductive load may have a unique switch matched to its capacitance.

The illustrative embodiments provide a long, thin inductor structure that provides sufficient inductance for resonant clocking. Some quality is lost; however, because flux capture is poor in spirals, the loss is not significant.

The illustrative embodiments also provide a programmable buffer with tunable latency and slew rate over the programming range. The programmable buffer provides two degrees of tuning, including course, full-strength design time tuning with a consistent front end-of-line footprint and dynamic tuning turning on and off portions of the driver. The programmable buffer has a constant front end-of-line (FEOL) footprint over all programming and tunable steps that can be adjusted at the back end-of-line (BEOL).

Wide Bandwidth Resonant Clock Distribution

Figure 1:
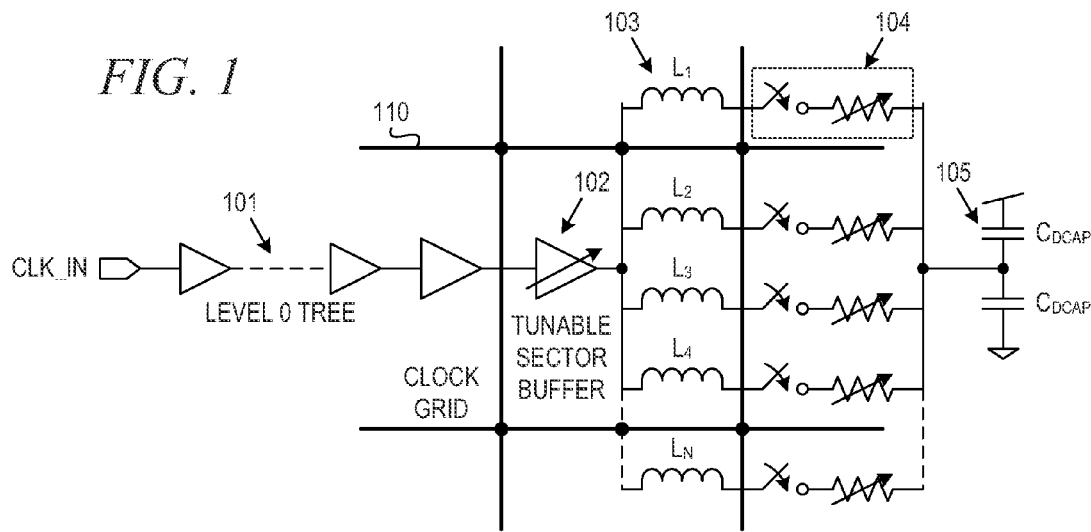
- FIG. 1 depicts a multiple mode resonant clock distribution in accordance with an illustrative embodiment.

FIG. 1 depicts a multiple mode resonant clock distribution in accordance with an illustrative embodiment. Clock grid 110 provides a global clock signal to components of an integrated circuit. The clock distribution receives the clock at level 0 (zero) tree 101, which provides the clock signal to tunable sector buffer 102. The tunable sector buffer 102 can be programmed to set latency and slew rate as will be described in further detail below.

The multiple mode resonant clock distribution uses a plurality of inductors 103 $L_1$-$L_N$ connected to clock grid 110. Inductors 103 $L_1$-$L_N$ are also connected through tunable resonant switches 104 to capacitors 105 $C_{DCAP}$. Each tunable resonant switch 104 comprises a switch and a variable resistor, as shown in FIG. 1.

Figure 2:
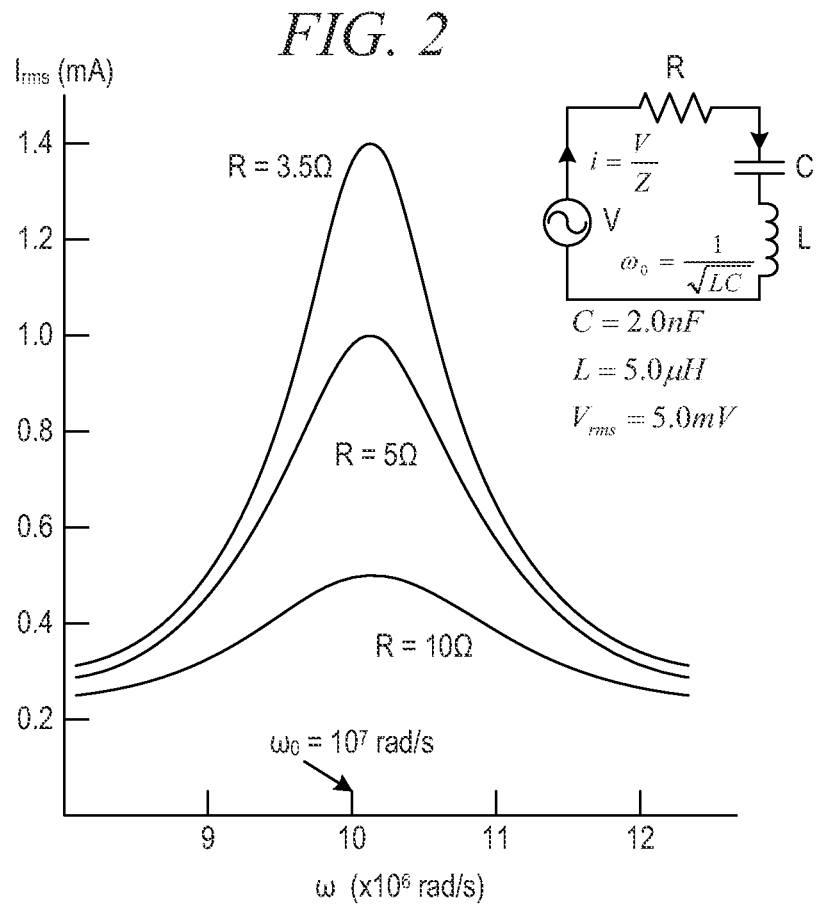
FIG. 2 illustrates tuning of a resonant clock in accordance with an illustrative embodiment.

Each inductor 103, tunable resonant switch 104, and capacitor 105 form an RLC circuit with a resonant frequency. FIG. 2 illustrates tuning of a resonant clock in accordance with an illustrative embodiment. As shown in FIG. 2, the resonant clock may be tuned by adjusting values of resistance, inductance, and capacitance. FIG. 2 shows current versus frequency with various values of resistance. Decreasing resistance results in an increase in amplitude, while increasing resistance results in a decrease in amplitude. Adjusting inductance affects the resonant frequency, shifting the curve left and right.

Returning to FIG. 1, the frequency of the resonant distribution for a single inductor is as follows:

$$f_1 = \frac{1}{2\pi\sqrt{L_1 C_{grid}}} \quad \text{(equation 1)}$$

The frequency of resonant distribution with multiple inductors is as follows:

$$f_n = \frac{1}{2\pi\sqrt{(L_1 \| L_2 \| \dots \| L_n) C_{grid}}} \quad \text{(equation 2)}$$

$$L_1 = L_2 = L_n \therefore f_n = \frac{\sqrt{n}}{2\pi\sqrt{L_1 C_{grid}}} \quad \text{(equation 3)}$$

where $C_{grid}$ is the parasitic capacitance of clock wires and gate capacitances of the next clock circuit that is driven.

Figure 3:
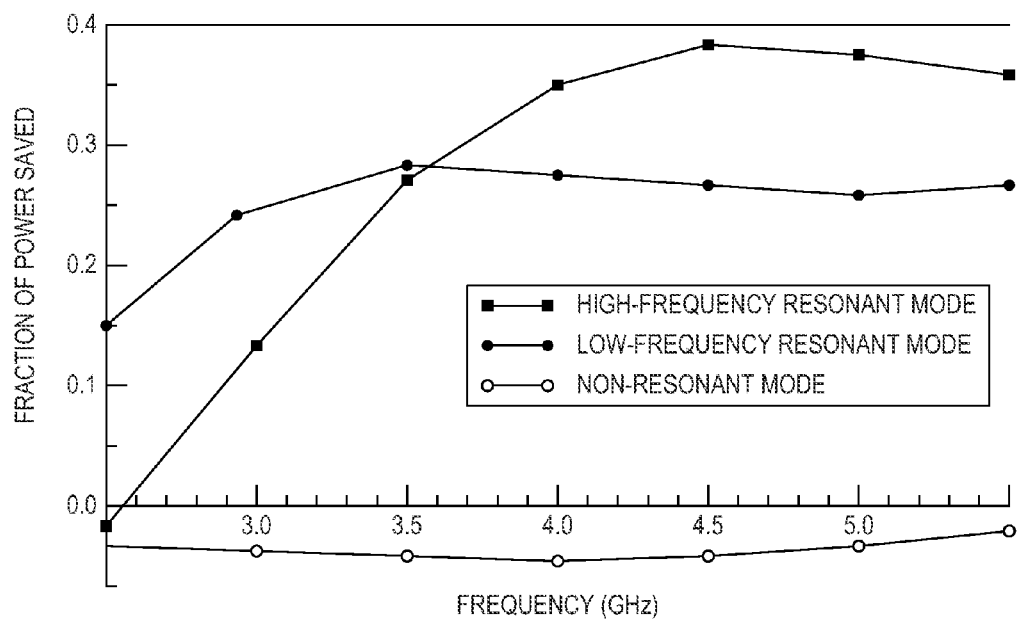
FIG. 3 shows power savings for a two inductor embodiment.

FIG. 3 shows power savings for a two inductor embodiment. As seen in FIG. 3, the high-frequency resonant mode provides power savings, particularly above 3.5 GHz operation. The low-frequency resonant mode provides power savings from 3.5 GHz down to 2.5 GHz. A non-resonant mode may be used below 2.5 GHz.

As will be appreciated by one skilled in the art, the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in any one or more computer readable medium(s) having computer usable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in a baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Computer code embodied on a computer readable medium may be transmitted using any appropriate medium, including but not limited to wireless, wireline, optical fiber cable, radio frequency (RF), etc., or any suitable combination thereof.

Computer program code for carrying out operations for aspects of the present invention may be written in any combination of one or more programming languages, including an object oriented programming language such as Java™, Smalltalk™, C++, or the like, and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to the illustrative embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions that implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus, or other devices to produce a computer implemented process such that the instructions which execute on the computer or other programmable apparatus provide processes for implementing the functions/acts specified in the flowchart and/or block diagram block or blocks.

Figure 4:
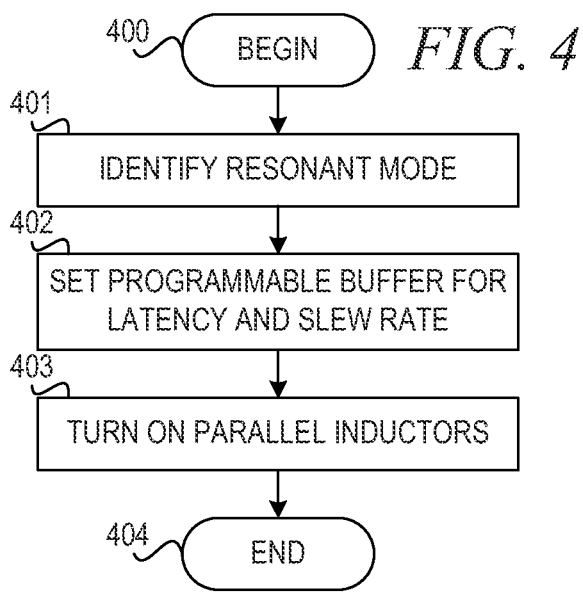
FIG. 4 is a flowchart illustrating operation of a mechanism for configuring a multiple mode resonant clock distribution in accordance with an illustrative embodiment.

FIG. 4 is a flowchart illustrating operation of a mechanism for configuring a multiple mode resonant clock distribution in accordance with an illustrative embodiment. Operation begins (block 400), and the mechanism identifies a resonant, or non-resonant, mode of operation for the clock distribution (block 401). The mechanism may identify the mode of operation for the clock distribution based on a desired frequency for the integrated circuit. For instance, in the two-inductor embodiment shown in FIG. 3, the mechanism may identify the operation mode to non-resonant mode for frequencies below 2.5 GHz, low-frequency resonant mode for frequencies between 2.5 GHz and 3.5 GHz, and high-frequency resonant mode for frequencies above 3.5 GHz.

The mechanism sets a programmable buffer for latency and slew rate (block 402). The programmable buffer may allow two degrees of tuning, including course full-strength design time tuning with a consistent FEOL footprint and dynamic tuning turning on and off portions of the driver, as will be described in further detail below.

The mechanism then turns on parallel inductors (block 403). The mechanism may turn on a number of inductors using tunable resonant switches based on the identified resonant mode. The mechanism may also gradually turn on parallel inductors to ensure the clock waveform is not adversely affected by the change in resonant mode. The manner in which inductors are turned on, or off as the case may be, will be described in further detail below. Thereafter, operation ends (block 404).

In conjunction, the sector buffer strength of the tunable sector buffer 102 (indicated in FIG. 1) may be decreased or increased as the parallel inductors are gradually enabled or disabled, respectively, via the resonant switches.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Figure 5:
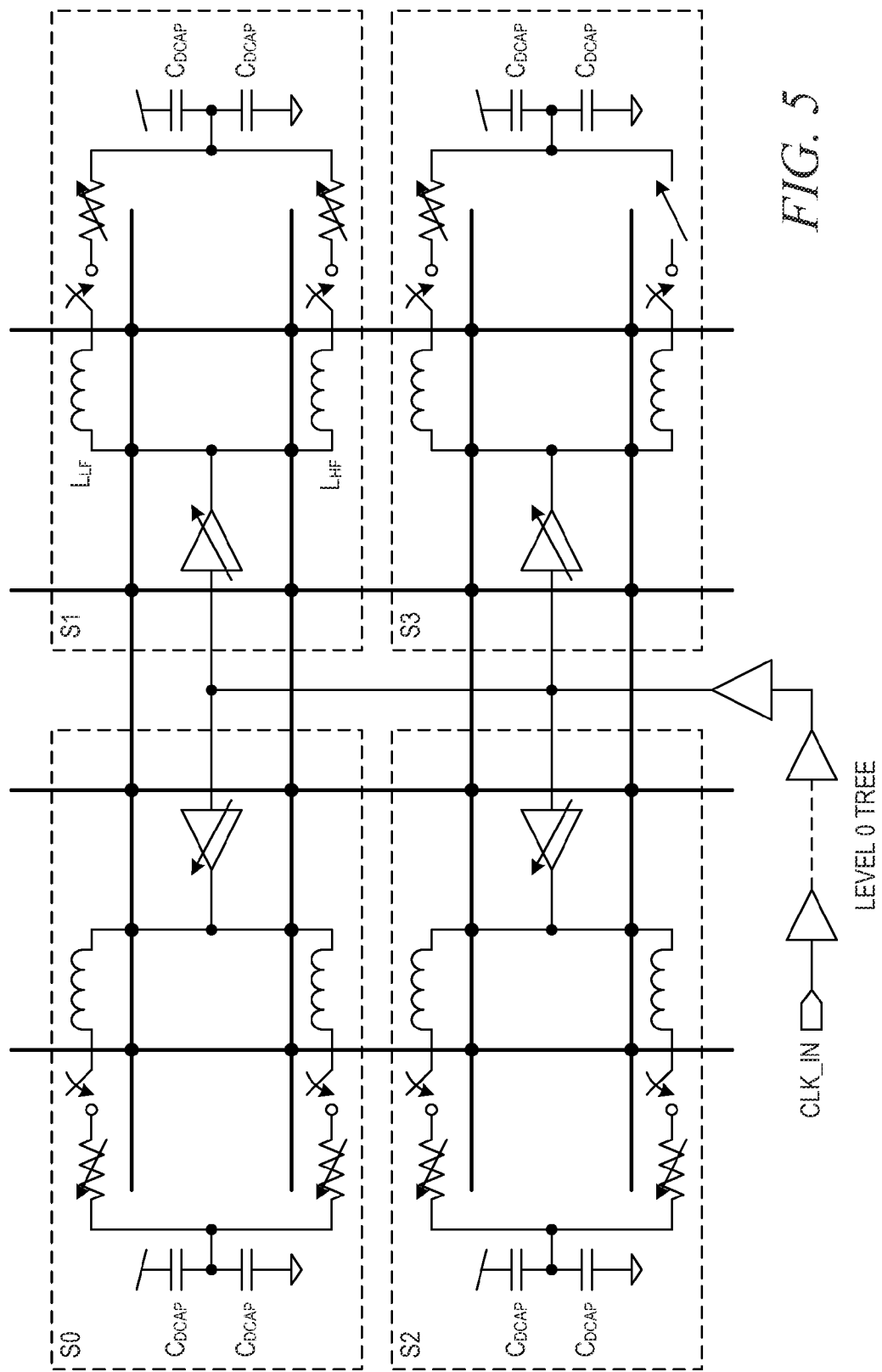
FIG. 5 depicts a four sector multiple mode resonant clock distribution in accordance with an illustrative embodiment.

FIG. 5 depicts a four sector multiple mode resonant clock distribution in accordance with an illustrative embodiment. The resonant clock distribution includes four sectors S0-S3, each having a tunable sector buffer connected to the clock grid and at least one tunable resonant switch connecting at least one inductor to capacitors. In an example embodiment, inductor $L_{LF}$ is on for a low frequency mode, and inductor $L_{HF}$ is on for a high frequency mode.

Programmable Sector Buffer

Figure 6:
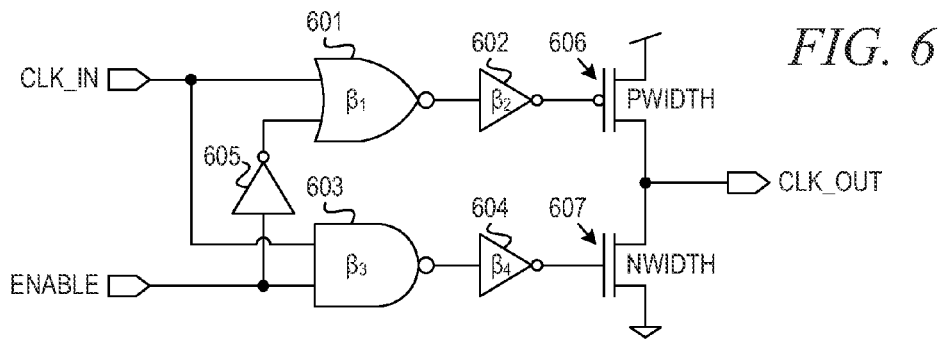
FIG. 6 depicts a programmable sector buffer in accordance with an illustrative embodiment.

FIG. 6 depicts a programmable sector buffer in accordance with an illustrative embodiment. The programmable sector buffer receives a clock in signal and an enable signal. Inverter 605 inverts the enable signal. Not OR (NOR) gate 601 receives the clock in signal and the inverted enable signal. Inverter 602 inverts the output of NOR gate 601 and provides the inverted signal to P-channel metal oxide semiconductor field effect transistor (MOSFET) 606.

Not AND (NAND) gate 603 receives the clock in signal and the enable signal. Inverter 604 inverts the output of NAND gate 603 and provides the inverted signal to N-channel MOSFET 607. P-channel MOSFET 606 and N-channel MOSFET 607 are connected in series and provide the clock out signal. NOR gate 601 ($\beta_1$), inverter 602 ($\beta_2$), NAND gate 603 ($\beta_3$), and inverter 604 ($\beta_4$) are designed to provide β ratios to control slew rates and latency values to be different according to the needed clock mode. The β ratios may be set to prevent shoot-through current in the clock output.

P-channel width (pwidth) of P-channel MOSFET 606 and N-channel width (nwidth) of N-channel MOSFET 607 control slew rates and power levels. Fingers are small transistors that add up to form a big transistor. Finger widths are chosen to facilitate integer strength changes for back end-of-line (BEOL) size replacement. The nominal strength sizing of transistors 606, 607 are matched to the load of the sector. All buffers have a predetermined number of tuning steps.

Figure 7A:
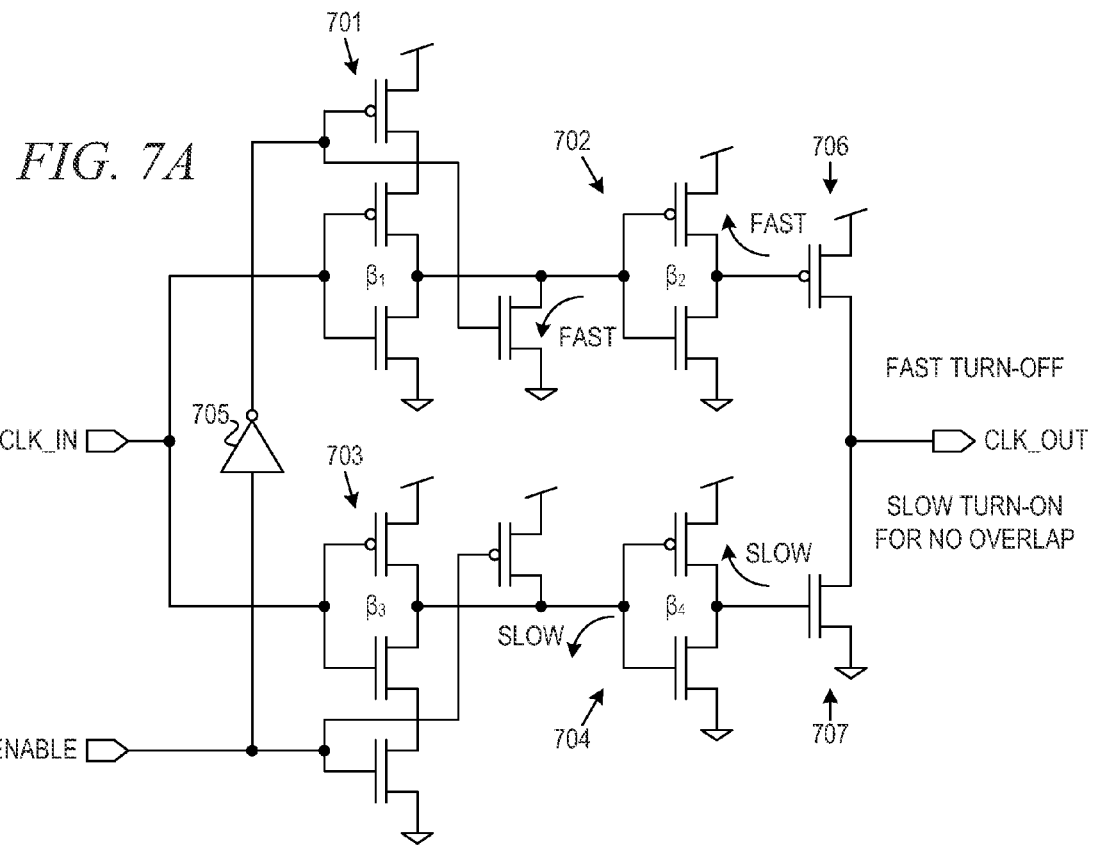
FIG. 7A shows output fall slew, latency, and power control for a programmable sector buffer in accordance with an illustrative embodiment.

FIG. 7A shows output fall slew, latency, and power control for a programmable sector buffer in accordance with an illustrative embodiment. The programmable sector buffer includes NOR gate 701, inverter 702, NAND gate 703, inverter 704, inverter 705, P-channel MOSFET 706, and N-channel MOSFET 707. The β ratios, pwidth, and nwidth may be designed for fast turn-off of P-channel MOSFET 706 and slow turn-on of N-channel MOSFET 707 for no overlap when both output transistors are on.

FIG. 7B shows output rise slew, latency, and power control for a programmable sector buffer in accordance with an illustrative embodiment. The β ratios, p-width, and n-width may be designed for slow turn-on of P-channel MOSFET 706 and slow turn-on of N-channel MOSFET 707 and fast turn-off of N-channel MOSFET 707 for no overlap.

Figure 8:
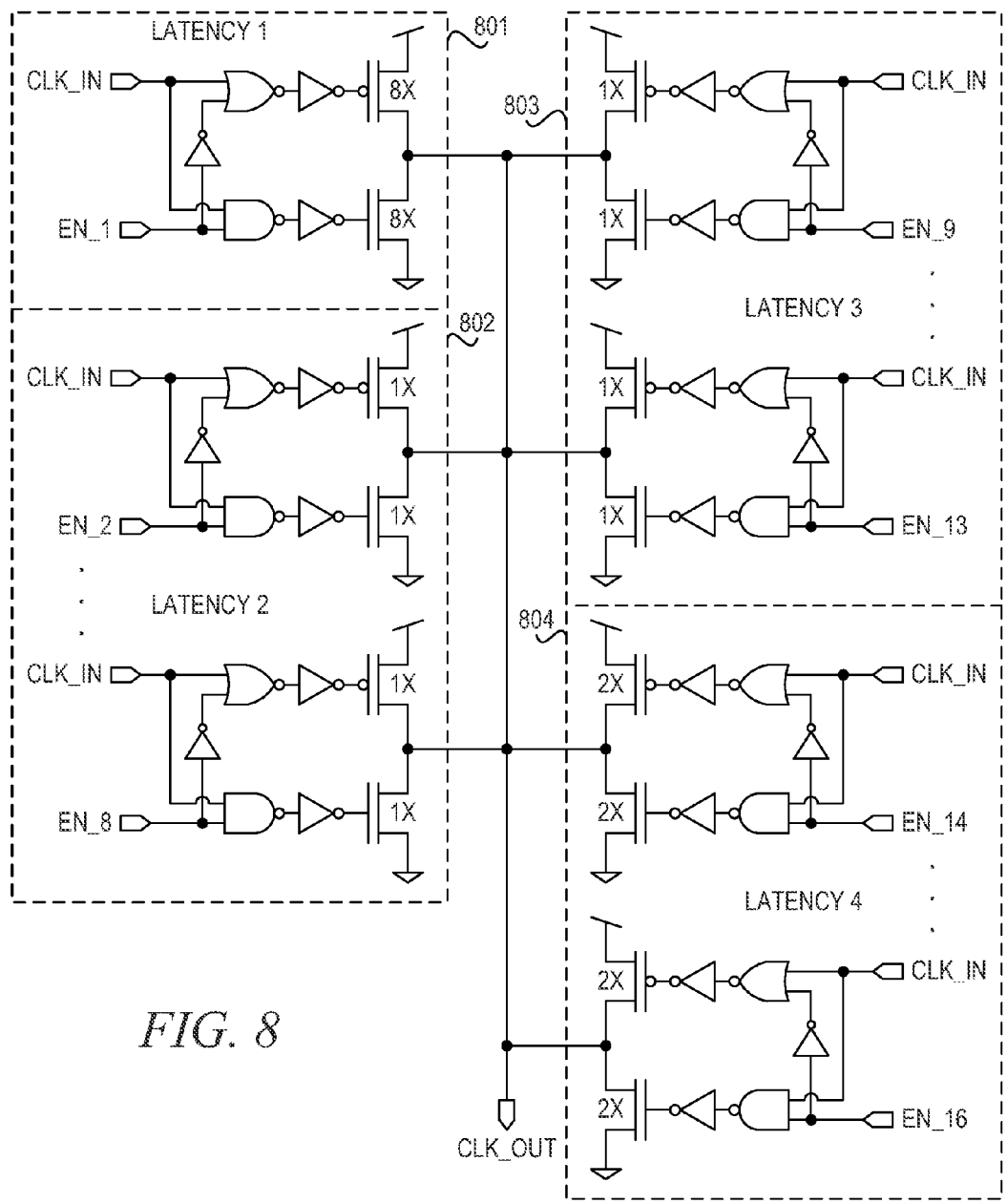
FIG. 8 depicts an implementation of a full strength sector buffer in accordance with an illustrative embodiment.

FIG. 8 depicts an implementation of a full strength sector buffer in accordance with an illustrative embodiment. The sector buffer in FIG. 8 includes a plurality of stages 801-804. Each stage 801-804 has tuned latency and slew. Each stage 801-804 prevents output shoot-through currents. Discrete slews and latencies blend over the tuning range. X is the base size of the driver and is an integer number of fingers. The co-efficient then indicates how many of the base size each sector is turning on. The ratios 8, 1, and 2 could change depending on the application and clock loading.

Each stage receives a clock input signal (CLK_IN) and one or more enable signals (e.g., EN_1, EN_2, EN_8, etc.). Control logic may tune latency and slew by asserting the enable signals corresponding to the desired resonant mode.

Figure 9:
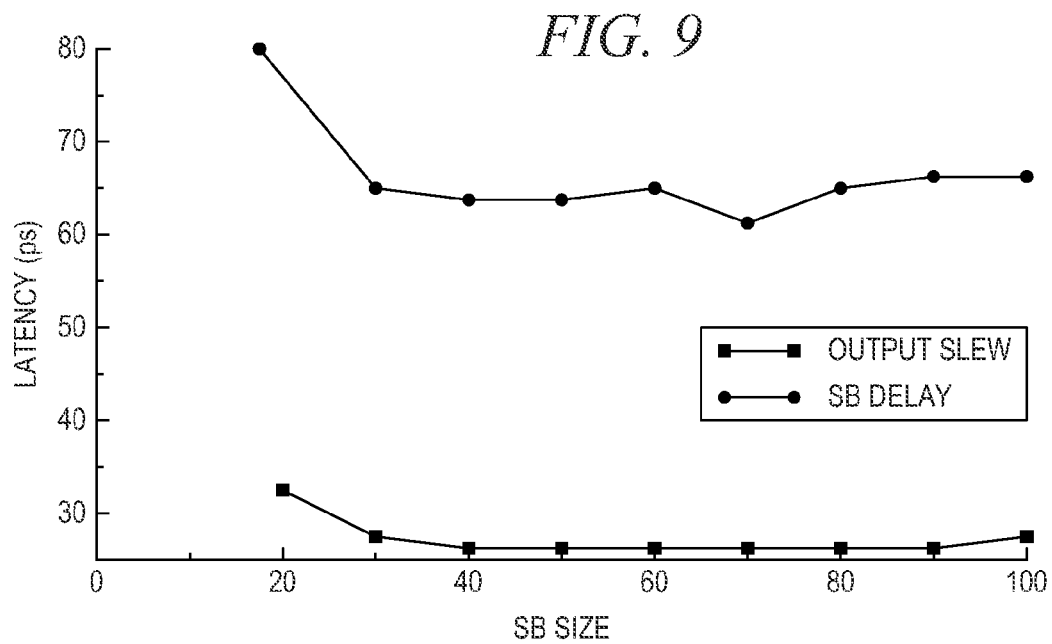
FIG. 9 shows latency change and slew over buffer size course tuning in accordance with an illustrative embodiment.
Figure 10:
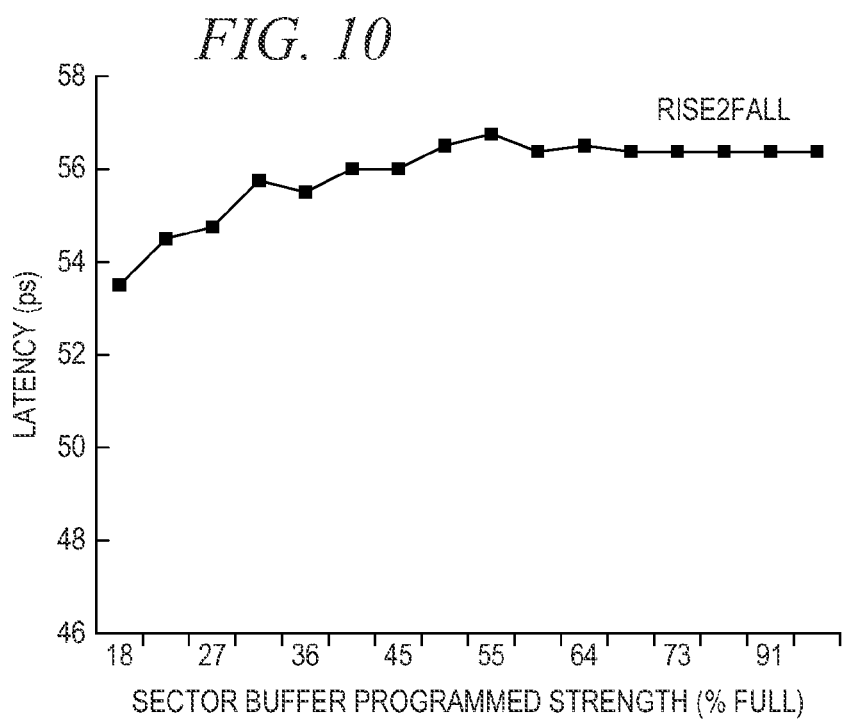
FIG. 10 shows increasing latency with programmed strength of the sector buffer in accordance with an illustrative embodiment.
Figure 11:
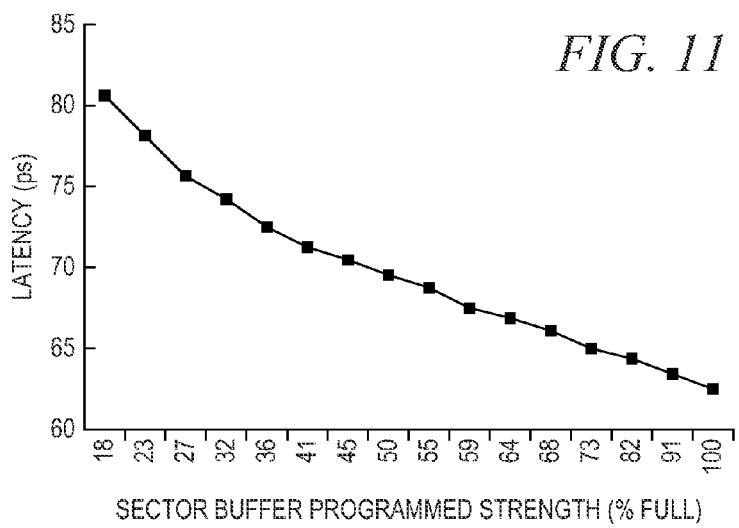
FIG. 11 shows decreasing latency with programmed strength of the sector buffer in accordance with an illustrative embodiment.
Figure 12:
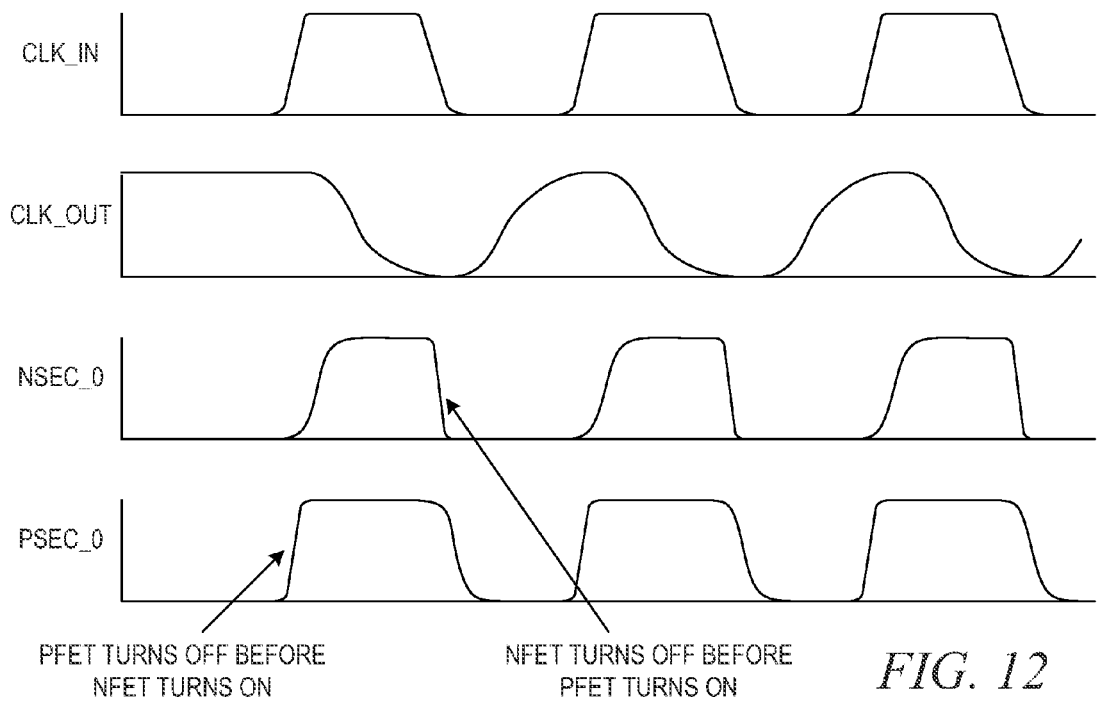
FIG. 12 shows non-overlapping switching to reduce shoot-through currents built into the driver of the sector buffer in accordance with an illustrative embodiment.

FIG. 9 shows latency change and slew over buffer size course tuning in accordance with an illustrative embodiment. FIG. 10 shows increasing latency with programmed strength of the sector buffer in accordance with an illustrative embodiment. FIG. 11 shows decreasing latency with programmed strength of the sector buffer in accordance with an illustrative embodiment. FIG. 12 shows non-overlapping switching to reduce shoot-through currents built into the driver of the sector buffer in accordance with an illustrative embodiment. As shown in FIG. 12, the P-channel MOSFET (PFET) turns off before the N-channel MOSFET (NFET) turns on, and the NFET turns off before the PFET turns on.

Figure 13A:
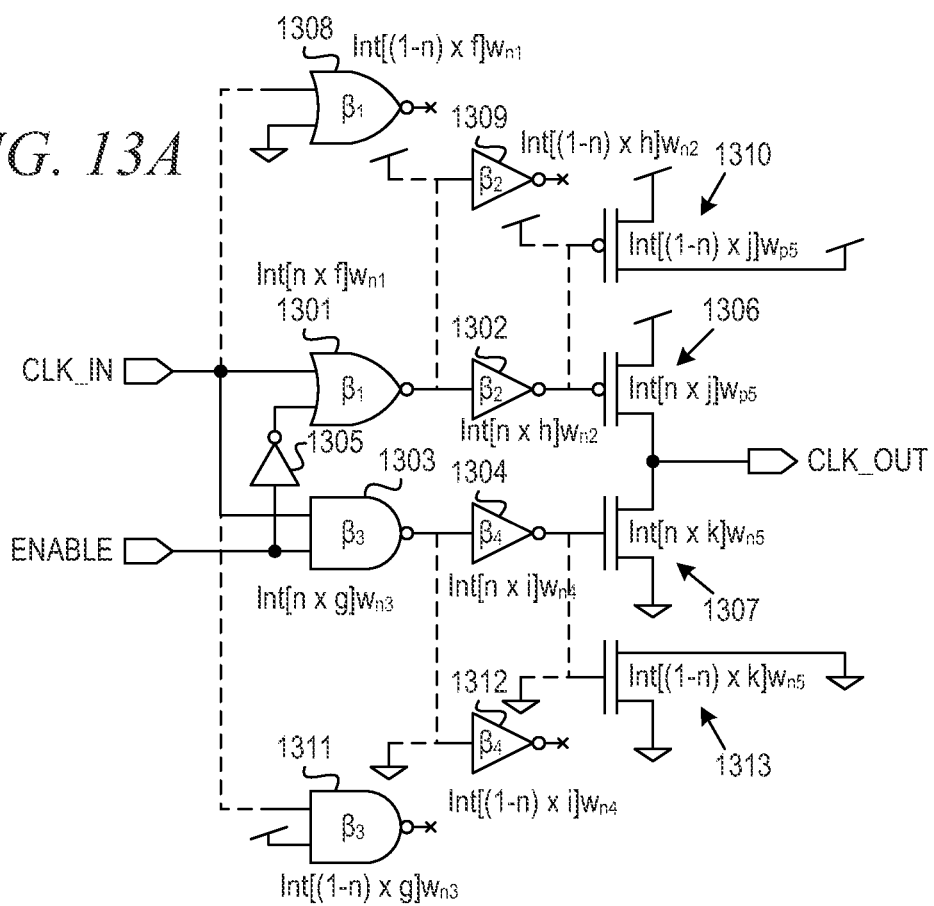
FIGS. 13A-13D depict a back end-of-line replaceable buffer design in accordance with an illustrative embodiment.

FIGS. 13A-13D depict a back end-of-line replaceable buffer design in accordance with an illustrative embodiment. With reference to FIG. 13A, the programmable sector buffer includes or NOR gate 1301, inverter 1302, NAND gate 1303, inverter 1304, inverter 1305, PFET 1306, and NFET 1307, as in FIG. 6. The programmable sector buffer may also include selectable PFET 1310 and selectable NFET 1313. One may add PFET 1310 and/or NFET 1313 by connecting along the dotted line in the metal layer in the back end-of-line (BEOL). One may add a plurality of such PFET 1310 and/or NFET 1313. Alternatively, one may use control signals to control how many of PFET 1310 and/or NFET 1313 are added.

One may add inverter 1309 and/or inverter 1312 by connecting along the dotted line in the metal layer in the BEOL. One may add a plurality of inverter 1309 and/or inverter 1312. Alternatively, one may use control signals to control how many of inverter 1309 and/or inverter 1312 are added.

One may add NOR gate 1308 and/or NAND gate 1311 by connecting along the dotted line in the metal layer in the BEOL. One may add a plurality of NOR gate 1308 and/or NAND gate 1311. Alternatively, one may use control signals to control how many of NOR gate 1308 and/or NAND gate 1311 are added.

In the example shown in FIG. 13A, n is the percentage of full strength, f is the number of fingers of NOR gate 1308, g is the number of fingers of NAND gate 1311, h is the number of fingers of inverter 1309, i is the number of fingers of inverter 1312, j is the number of fingers of PFET 1310, and k is the number of fingers of NFET 1313. In the example, $w_n$ and $w_p$ represent the single finger width of NFETs and PFETs in the buffer design. The buffer sizes may be linear or geometric.

Figure 13B:
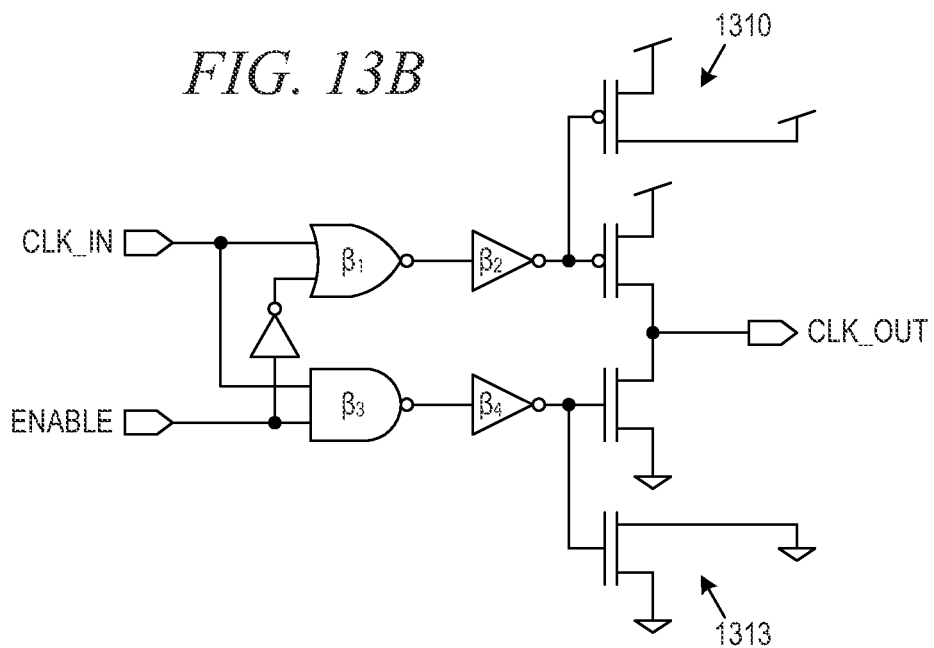

FIG. 13B depicts a small gain, high power BEOL replaceable buffer design in accordance with an example embodiment. The small gain, high power buffer design includes added PFET 1310 and NFET 1313, but includes no added NOR gates or NAND gates and no added inverters.

Figure 13C:
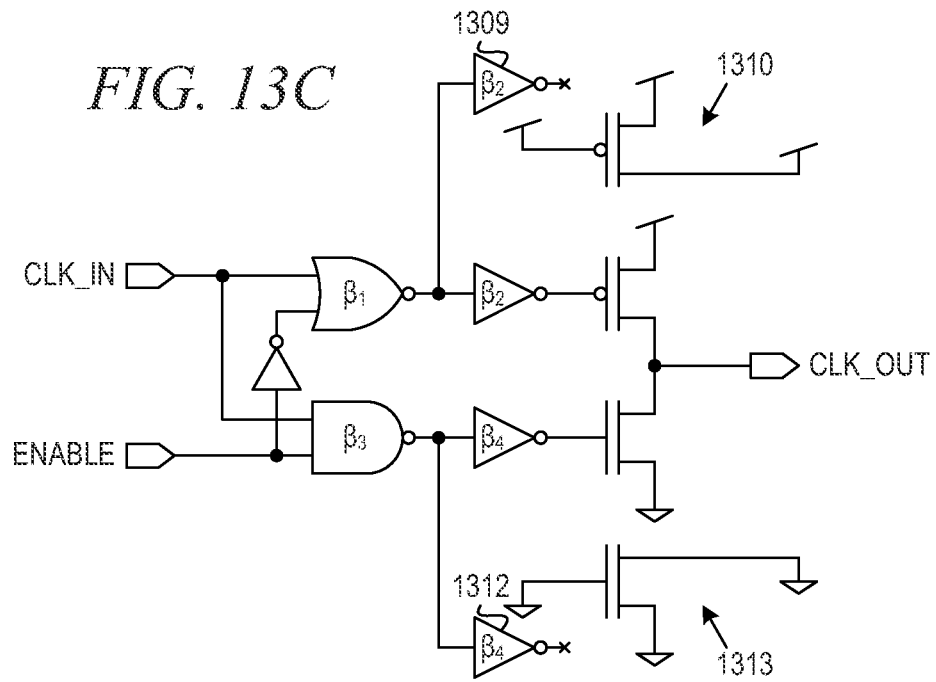

FIG. 13C depicts a small gain, small finger, low power BEOL replaceable buffer design in accordance with an example embodiment. The small gain, small finger, low power buffer design includes added inverters 1309, 1312.

Figure 13D:
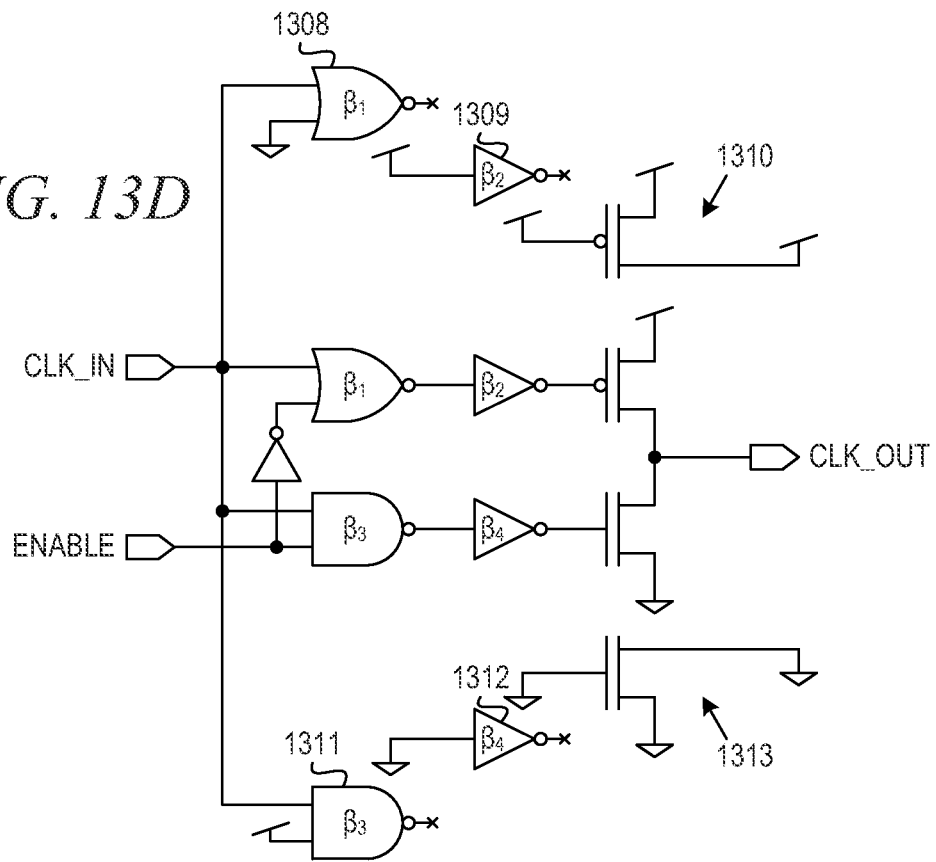

FIG. 13D depicts a large gain or large finger BEOL replaceable buffer design in accordance with an example embodiment. The large gain or large finger design includes added NOR gate 1308 and added NAND gate 1311.

Variable Resistance Switch

Returning to FIG. 1, tunable resonant switch 104 has a width matched to inductance. Higher frequency may use lower inductance, according to equations 1 through 3, and correspondingly lower resistance (i.e. wider FETs that implement one or more switches). The switch is designed so that its resistance be carefully reduced or increased over a number of cycles.

Figure 14:
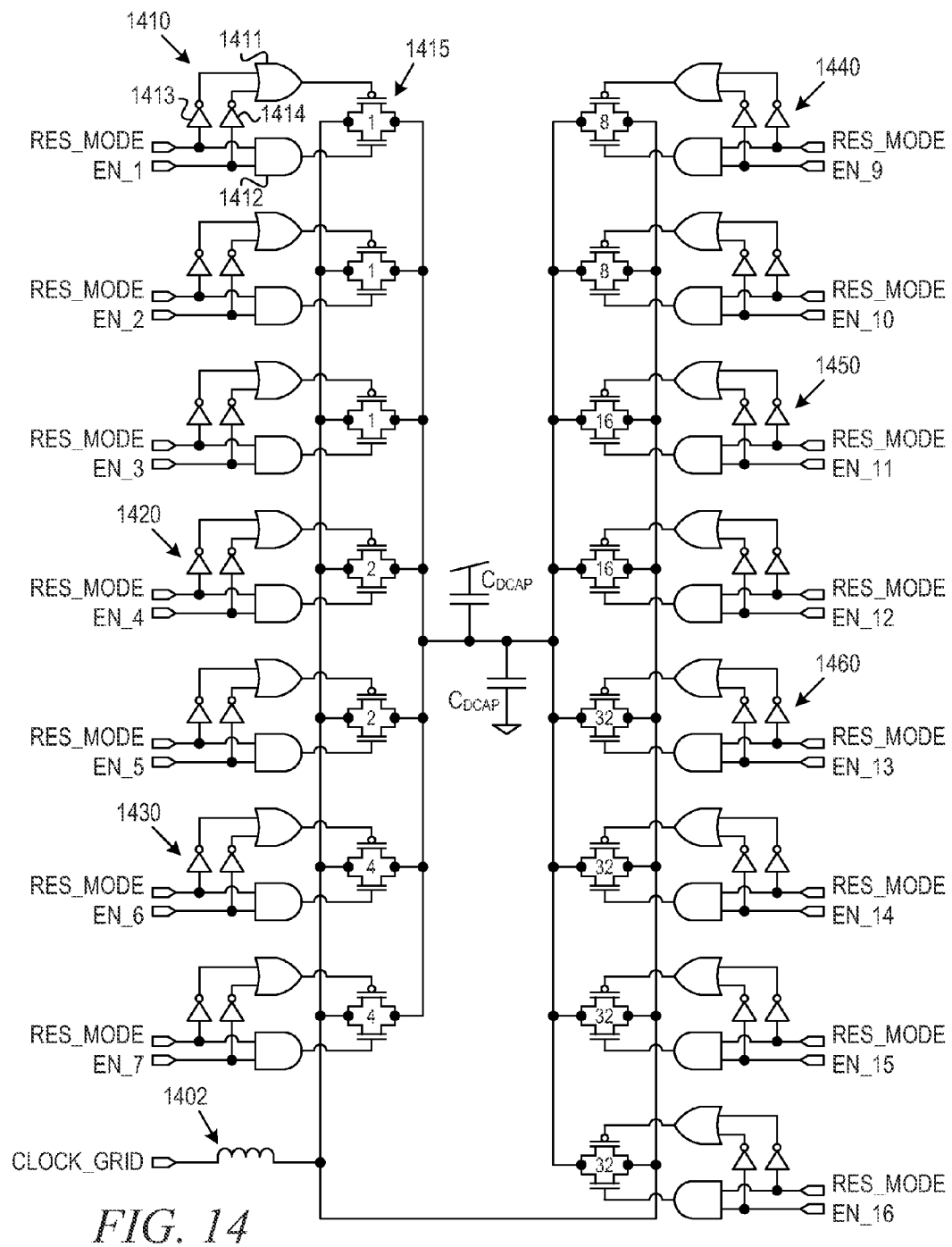
FIG. 14 depicts a switch block for a single inductor in accordance with an illustrative embodiment.

FIG. 14 depicts a switch design for a single inductor in accordance with an illustrative embodiment. The switch block includes a plurality of steps, such as steps 1410, 1420, 1430, 1440, 1450, 1460. In step 1410, inverter 1413 receives a resonant mode (RES_MODE) signal, and inverter 1414 receives an enable (EN_1) signal. OR gate 1411 receives as input the inverted resonant mode signal and the inverted enable signal and provides its output to the gate of the PFET in switch component 1415. AND gate 1412 receives the resonant mode signal and the enable signal and provides output to the gate of the NFET in switch component 1415.

If the resonant mode signal is de-asserted (low) and the enable signal EN_1 is de-asserted (low), the output of OR gate 1411 is high and the output of AND gate 1412 is low, in which case both the PFET and the NFET of switch component 1415 are in an off state. If the resonant mode signal is de-asserted (low) and the enable signal EN_1 is asserted (high), the output of OR gate 1411 is high and the output of AND gate 1412 is low, in which case both the PFET and the NFET of switch component 1415 are in an off state. If the resonant mode signal is asserted (high) and the enable signal EN_1 is de-asserted, the output of OR gate 1411 is high and the output of AND gate is low, in which case both the PFET and the NFET of switch component 1415 are in an off state. If the resonant mode signal is asserted and the enable signal EN_1 is asserted, the output of OR gate 1411 is low and the output of AND gate 1412 is high, in which case both the PFET and the NFET of switch component 1415 are in an on state. Thus, switch component 1415 is only turned on when the resonant mode signal is asserted and the enable signal EN_1 is asserted.

When switch component 1415 is turned on, current flows through inductor 1402 and through switch component 1415 into capacitors $C_{DCAP}$. Thus, control logic can turn the switch design on in steps by asserting the enable signals EN_1, EN_2, EN_3, etc. The sizes of the steps can be the same, steps can get linearly bigger, or they can get geometrically bigger. If they are the same, the output drive of each step is the same. If linear, then each successive output driver may increase one finger, for example. If geometric, the first step may have one finger, the second step may have two fingers, the third step may have four fingers, the fourth step may have eight fingers, etc. Another way to vary them would be to have all fingers the same, but turn them on in different increments. In one embodiment, they may be turned on one at a time. In another embodiment, control logic may turn on one finger, then two fingers, then four fingers, etc. As control logic enables switches, conductivity increases and resistance decreases.

In the depicted example, the switches in the switch design have step sizes of 1, 2, 4, 8, 16, and 32. For instance, step 1410 has a step size of 1, step 1420 has a step size of 2, step 1430 has a step size of 4, step 1440 has a step size of 8, step 1450 has a step size of 16, and step 1460 has a step size of 32. Switching is fully programmable. Step sizes are chosen to permit a gradual inclusion or exclusion of resonant energy into or out of the clock grid, respectively, so that differences in time elapsing between like clock edges (e.g., falling clock) are minimized. This difference in time between successive falling (or rising) edges is known as the cycle time. It should remain constant or be very gradually (infinitesimally) shifted to ensure the functionality of the synchronous circuits managed by the clock. Also beneficial may be the interleaving of adjustments of sector buffer strengths with enablement or disablement of FET steps within the switches. Step sizes are the number of output fingers or driver width. Each inductor has a switch that will be turned on when enabling it into the resonant circuit. For lower frequency designs, fewer inductors are turned on.

Figure 15:
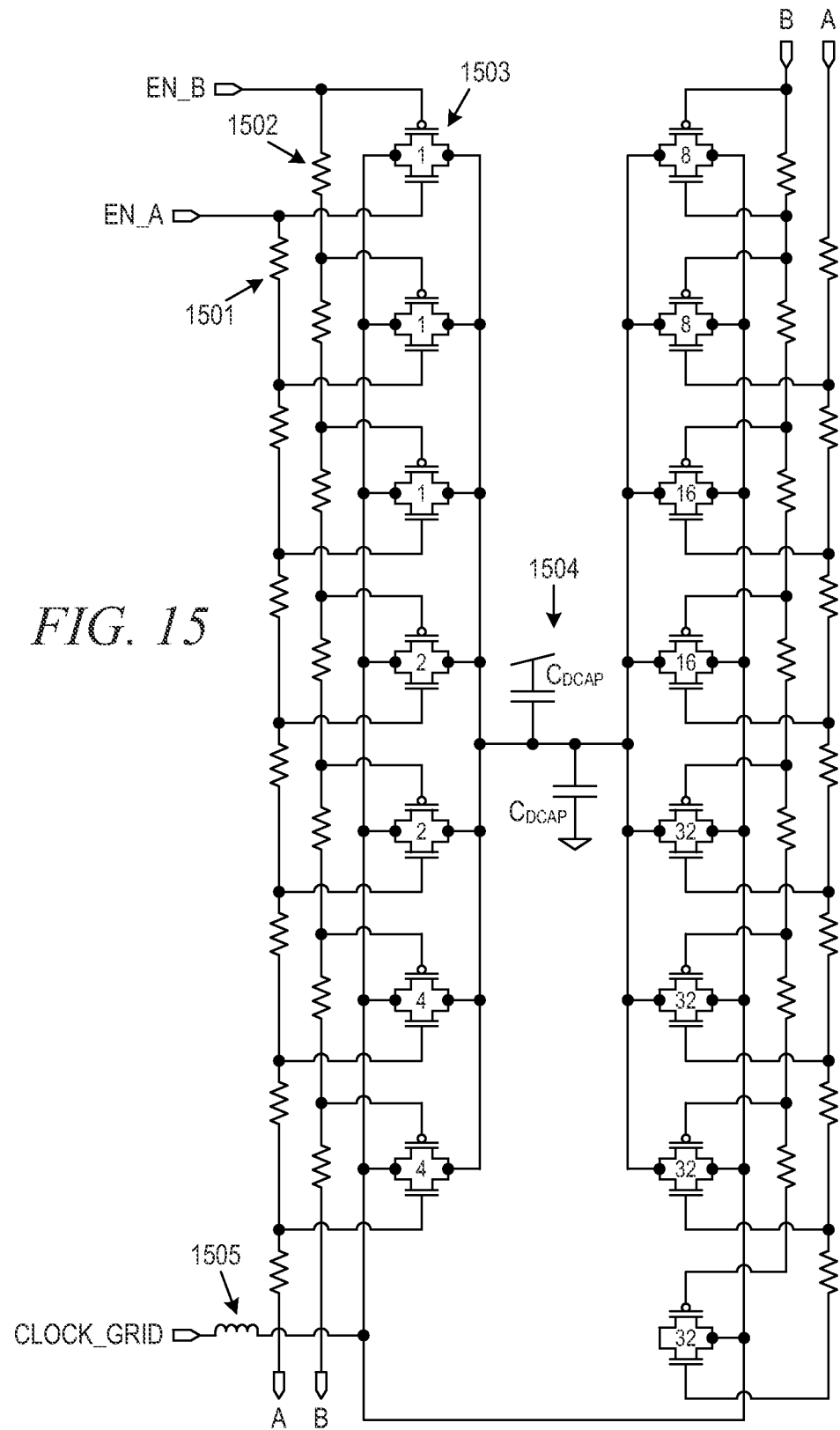
FIG. 15 depicts a switch design with RC filter on gate input in accordance with an illustrative embodiment.

FIG. 15 depicts a switch design with RC filter on gate input in accordance with an illustrative embodiment. Control logic asserts enable signals EN_A and EN_B. The EN_A signal propagates through resistors 1501 and the EN_B signal propagates through resistors 1502. As EN_A and EN_B propagate, each switch component 1503 turns on gradually and successively, causing gradually more and more current to flow through inductor 1505 from the clock grid, through switch components 1503, and to capacitors $C_{DCAP}$ 1504, or vice versa with respect to the inductor current.

The switch design in FIG. 15 uses resistor-capacitor (RC) delay to self-time switching of individual switch components 1503. The switch design shown in FIG. 15 uses two enable signals, saving control signals. In an alternative embodiment, the switch design may include AND and OR functions to control which portions turn on similar to the embodiment shown in FIG. 14.

Figure 16:
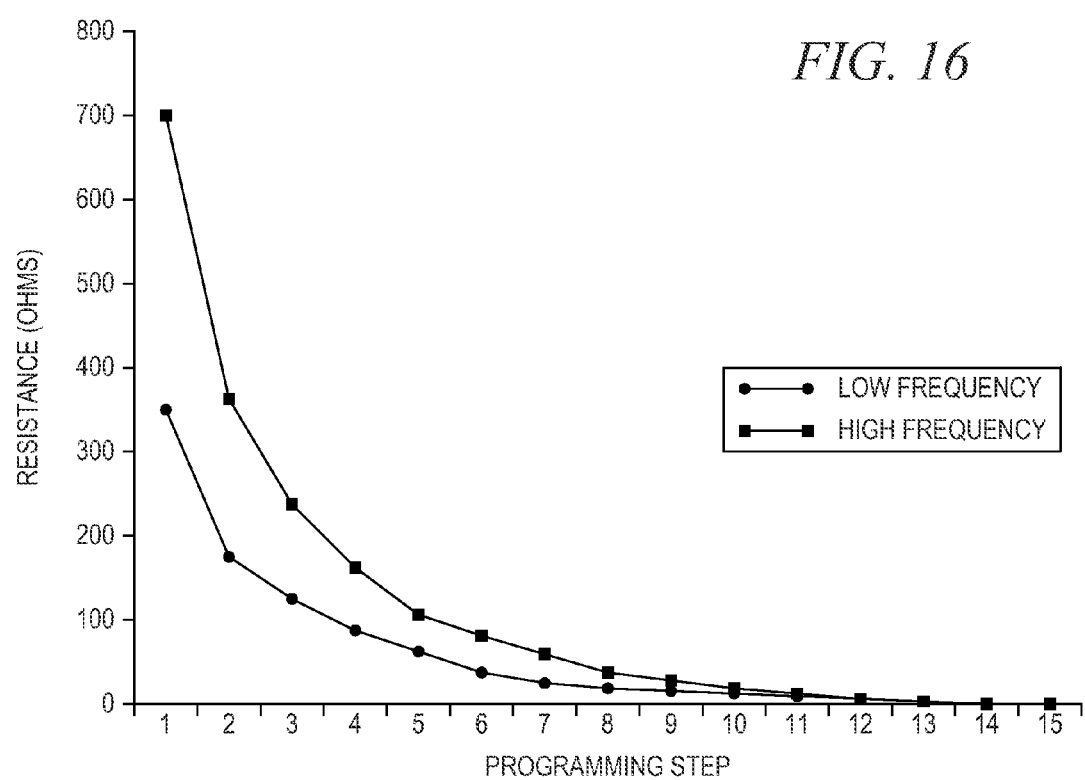
FIG. 16 shows a change in switch resistance with programming steps in accordance with an illustrative embodiment.

FIG. 16 shows a change in switch resistance with programming steps in accordance with an illustrative embodiment. As switches are turned on, either through control signals or RC delay propagation, the resistance decreases and conductivity increases.

FIG. 17 illustrates a pattern of steps to enter resonant mode in accordance with an illustrative embodiment. The switch design turns on step by step (column by column in the FIG. 17). Control logic uses linear stepping with non-linear step sizes in the programmable switch. Other embodiments may use non-linear stepping, linear step sizes, or some other combination of to achieve the turn-on characteristics required. It should also be noted that the sector buffer strength is ramped down while more and more switches (steps) are enabled.

Figure 18A:
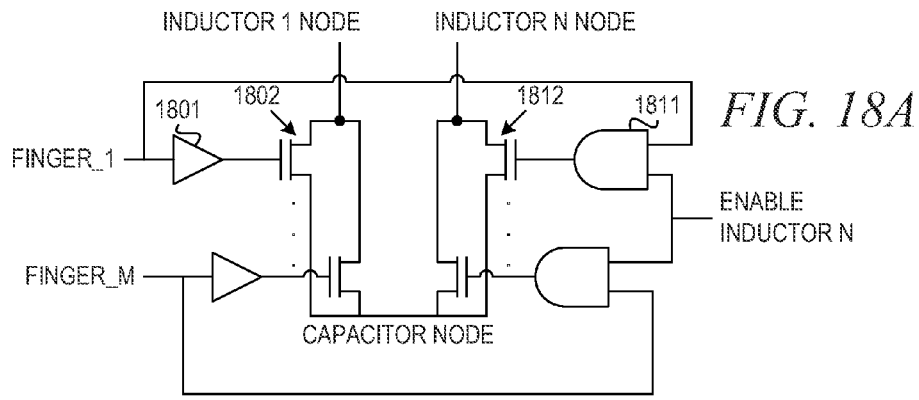
FIG. 18A depicts a tunable resonant switch and its control logic control structure in accordance with an illustrative embodiment.
Figure 18B:
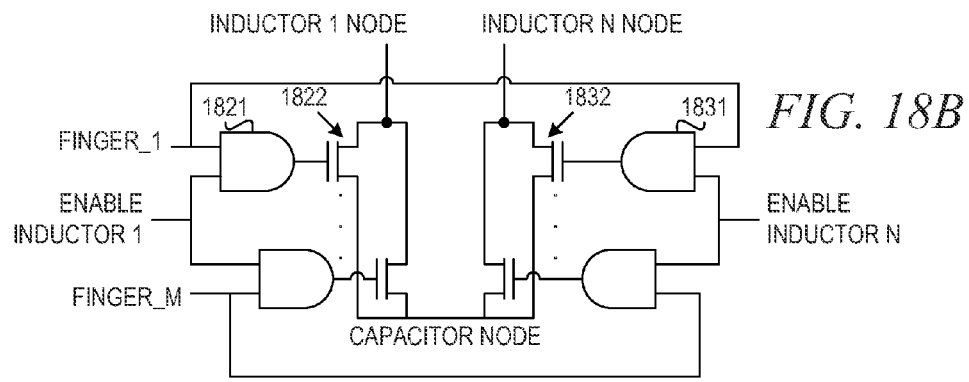
FIG. 18B depicts a tunable resonant switch and its control logic control structure in accordance with an illustrative embodiment.

FIGS. 18A and 18B depict a tunable resonant switch control logic control structure in accordance with an illustrative embodiment. In the depicted example shown in FIG. 18A, the tunable resonant switch comprises a plurality of inductor nodes, each having a plurality of fingers. A first inductor node, inductor 1 node, is enabled by default if at least one finger is enabled. If none of the finger enable signals (FINGER_1 to FINGER_M) are enabled, then none of the inductor nodes are enabled, and the clock distribution is in non-resonant mode. Each other inductor node, such as inductor N node is enabled using an inductor enable signal, such as enable inductor N signal.

Buffer 1801 receives the first finger enable signal and provides the signal to transistor 1802. Thus, with FINGER_1 enabled, transistor 1802 turns on and current flows from the inductor 1 node to the capacitor node. As more fingers are enabled, more transistors turn on, allowing more current to flow from inductor 1 node to the capacitor node.

For inductor N node, AND gate 1811 receives the first finger enable signal and the enable inductor N signal. If inductor N is enabled and finger 1 is enabled, then AND gate 1811 turns on transistor 1812, allowing current to flow from inductor N node to the capacitor node. As more fingers are enabled, more transistors turn on, allowing more current to flow from inductor N node to the capacitor node. The control logic may then enable as many inductors as needed and then ramp up the current by asserting the finger enable signals.

The tunable resonant switch control logic of FIG. 18A provides uniform conduction increases and uniform conduction decreases. The control logic shown in FIG. 18A also provides a switch off state for non-resonant mode (i.e., FINGER_1 through FINGER_M inputs set to 0). The control structure provides for selection of a specific subset of parallel inductors (i.e., ENABLE INDUCTOR N), all with reasonably minimal control logic. It should be noted here that finger control may be shared across inductor switches. In this way, one or more parallel inductors may be introduced to both store and source energy to the clock grid. Generally speaking the greater the number of parallel inductors the higher the resonant frequency as expressed by equation 3.

FIG. 18B depicts a tunable resonant switch control logic in accordance with an alternative embodiment. The tunable resonant switch shown in FIG. 18B includes N inductors and M fingers. AND gate 1821 receives a finger enable signal and an inductor enable signal for inductor 1 node and finger 1. If the inductor enable signal for inductor 1 is asserted and the finger enable signal for finger 1 are enabled, AND gate 1821 turns on transistor 1822, allowing current to flow from inductor 1 node to the capacitor node. Similarly, AND gate 1831 receives a finger enable signal and an inductor enable signal for inductor N node and finger 1. If the inductor enable signal for inductor N is asserted and the finger enable signal for finger 1 are enabled, AND gate 1831 turns on transistor 1832, allowing current to flow from inductor N node to the capacitor node. The control logic may then enable as many inductors as needed and then ramp up the current by asserting the finger enable signals.

Figure 19A:
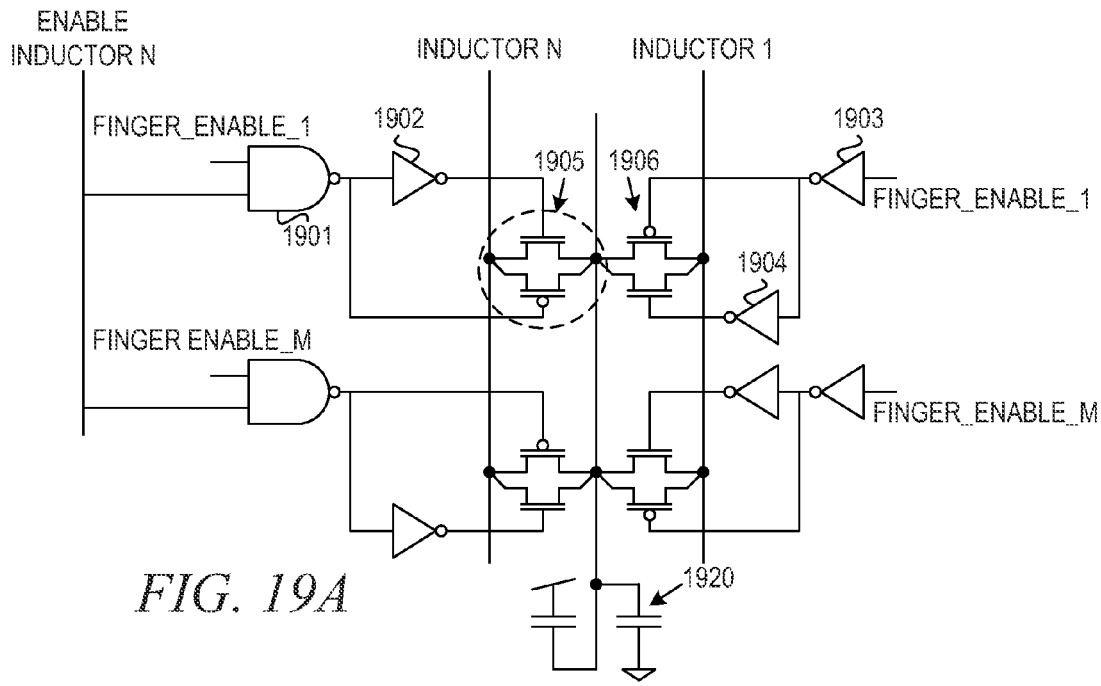
FIG. 19A depicts a full pass gate tunable resonant switch in accordance with an illustrative embodiment.

FIG. 19A depicts a full pass gate tunable resonant switch in accordance with an illustrative embodiment. The full pass gate embodiment shown in FIG. 19A includes an inductor N node for a high frequency resonant mode and an inductor 1 node for a low frequency resonant mode. NAND gate 1901 receives enable inductor N signal and a finger enable signal. Inverter 1902 receives the output of NAND gate 1901 and provides the inverted signal to the NFET of full pass gate 1905. The output of NAND gate 1901 is provided to the PFET of pass gate 1905.

In the case that the highest frequency resonant mode is desired, parallel inductors are enabled. The enable inductor signal(s) and the finger signals (i.e., FINGER_ENABLE_1 through FINGER_ENABLE_M) are all asserted (high), pass gates 1905 and 1906 are turned on, and current flows from the inductor N node and the inductor 1 node to the capacitor node 1920 through full pass gates 1905 and 1906, respectively. If the finger enable signals are de-asserted (low), pass gates 1905 and 1906 are turned off, and current does not flow from either the inductor N node or inductor 1 node to the capacitor node 1920 through full pass gates 1905 and 1906, respectively.

In the case that the lowest frequency resonant mode is desired, only the low frequency inductor (e.g., inductor 1) is enabled. High frequency inductors are disabled by setting "enable inductor N" to a low.

Inverter 1903 receives a finger enable finger for the low frequency resonant mode and provides the inverted finger enable signal to the PFET of full pass gate 1906. Inverter 1904 inverts the finger enable signal and provides the inverted signal to the NFET of full pass gate 1906. If the finger enable signal is asserted (high), the full pass gate 1906 is turned on, and current flows from the inductor 1 node to the capacitor node 1920 through full pass gate 1915. If the finger enable signal is de-asserted (low), full pass gate 1906 is turned off, and current does not flow from the inductor 1 node to the capacitor node 1920 through full pass gate 1915.

The tunable resonant switch shown in FIG. 19A may have two or more fingers such that control logic may turn on the tunable resonant switch in steps. The finger enable signal(s) received by NAND gate 1901 and inverter 1903 may be the same signal. Full pass gates 1905, 1915 reduce transition sensitivity to power supply and device type. Full pass gates 1905, 1915 minimize cycle collapse sensitivity during transition from non-resonant to resonant mode.

Figure 19B:
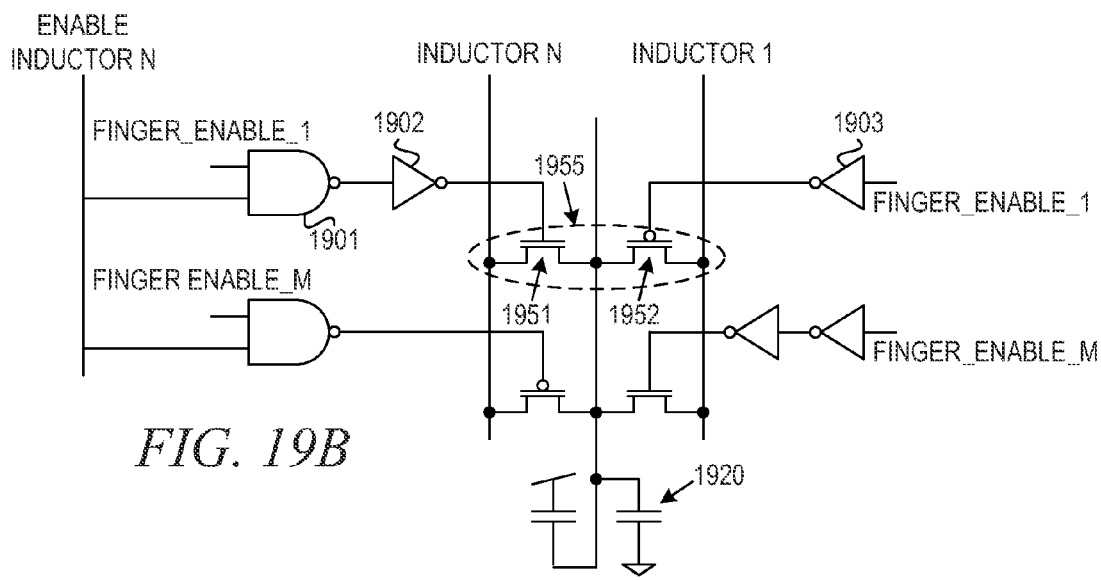
FIG. 19B illustrates a full pass gate embodiment with incremental enablement of a full pass gate for high frequency mode only in accordance with an illustrative embodiment.

FIG. 19B illustrates a full pass gate embodiment with incremental enablement of a full pass gate for high frequency mode only in accordance with an illustrative embodiment. The embodiment of FIG. 19B reduces the size of the control logic and the number of discrete transistors (by a factor of 2)—but not the total FET width, which should remain proximately constant—with respect to FIG. 19A. One benefit is the circuit size and its wiring congestion can be reduced.

In considering the operation of FIG. 19B more specifically, inverter 1903 receives a finger enable finger for the low frequency resonant mode and provides the inverted finger enable signal to PFET 1952. If the finger enable signal is asserted (high), PFET 1952 is turned on, and current flows from the inductor 1 node to the capacitor node 1920 through PFET 1952. If the finger enable signal is de-asserted (low), PFET 1952 is turned off, and current does not flow from the inductor 1 node to the capacitor node 1920 through PFET 1952.

NAND gate 1901 receives enable inductor N signal and a finger enable signal. Inverter 1902 receives the output of NAND gate 1901 and provides the inverted signal to NFET 1951. If the enable inductor N signal and the finger enable signal are both asserted (high), NFET 1951 is turned on, and current flows from the inductor N node to the capacitor node 1920 through NFET 1951. If either the enable inductor N signal or the finger enable signal is de-asserted (low), NFET 1951 is turned off, and current does not flow from the inductor N node to the capacitor node 1920 through NFET 1951.

In high frequency resonant mode, where ENABLE INDUCTOR HIGH has been set high, assertion of the finger enable signal for this finger of the switch incrementally enables both NFET 1951 and PFET 1952, which together form a full pass gate 1955, to desensitize the timing of the clock from idiosyncratic sensitivities of the NFETs and PFETs when the maximum energy is sourced by the resonant network. In other words, a full pass gate 1955 switch reduces transition sensitivity to power supply and device type. The incremental full pass gate embodiment shown in FIG. 19B substantially reduces control logic and wire congestion relative to the embodiment in FIG. 19A. The tunable resonant switch shown in FIG. 19B lowers leakage slightly due to the reduced size of the control logic.

Figure 20:
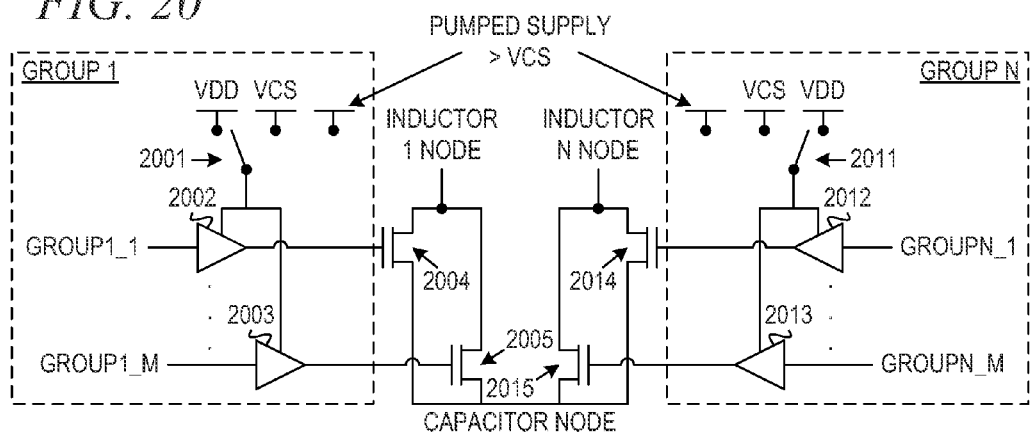
FIG. 20 depicts a combined digital and voltage tuning resonant switch in accordance with an illustrative embodiment.

FIG. 20 depicts a combined digital and voltage tuning resonant switch in accordance with an illustrative embodiment. The combined digital and voltage tuning switch depicted in FIG. 20 includes N groups each having M fingers. The signal prefix "Group1" indicates that FETs 2004, 2005 connect the INDUCTOR 1 NODE to the CAPACITOR NODE. The signal prefix "GroupN" indicates that FETs 2014, 2015 connect the INDUCTOR N NODE to the CAPACITOR NODE.

For group 1, finger signal GROUP1_1 is received at voltage buffer 2002, which provides the finger signal to NFET 2004, and finger signal GROUP1_M is received at voltage buffer 2003, which provides the finger signal to NFET 2005. For group N, finger signal GROUPN_1 is received at voltage buffer 2012, which provides the finger signal to NFET 2014, and finger signal GROUPN_M is received at voltage buffer 2013, which provides the finger signal to NFET 2015.

Voltage buffers 2002, 2003 receive supply voltage through switch 2001, which switches between VDD, VCS, and a pumped supply voltage. Voltage buffers 2012, 2013 receive supply voltage through switch 2011, which switches between VDD, VCS, and a pumped supply voltage. Switches 2001, 2011 may incrementally increase or decrease the voltage. Higher gate voltages make the N type FETs, shown herein, more conductive. Total FET conductance is regulated by a combination of digital addition/subtraction and voltage switching. Switches 2001, 2011 increases conductivity of the switch may resolve, for example, to a peak voltage for resonant mode operation, supplied by a pumped supply that is defined as follows:

$$V\_Pump_{mzx} = VDD_{clock\_grid}/2 \quad \text{(equation 4)}$$

For simplicity, equation 4 defines the peak reliability voltage permissible for a three terminal silicon-on-insulator FET, given that the source-drain voltages, in resonant mode, are half the high voltage of the clock grid (i.e., $VDD_{clock\_grid}/2$). The combined digital and voltage tuning resonant switch of FIG. 20 permits finite resistance changes within each FET of a pass gate and thus minimizes disruption in the clock.

Figure 21:
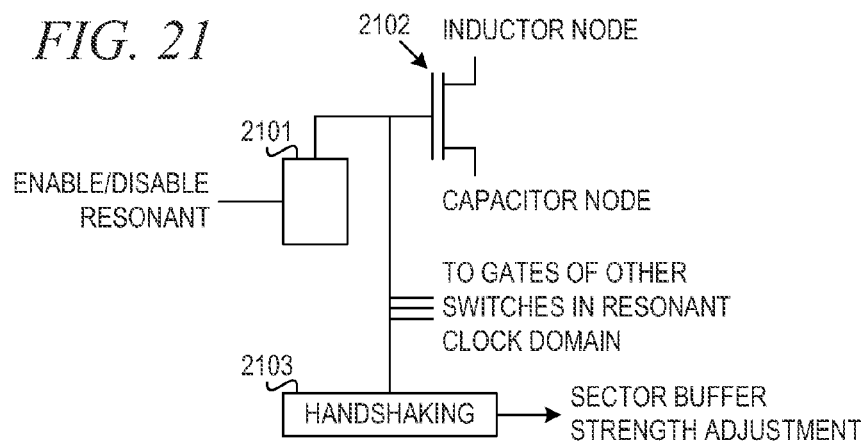
FIG. 21 depicts an analog voltage ramp tunable resonant switch in accordance with an illustrative embodiment.

FIG. 21 depicts an analog voltage ramp tunable resonant switch in accordance with an illustrative embodiment. Voltage supply 2101 may be a pumped supply (or may be a regular voltage supply) that gradually moves from ground (GND) to $V\_Pump_{max}$ (of equation 4) and vice versa. Voltage supply 2101 provides voltage to the gate of FET 2102, as well as to the gates of the other switches in the resonant clock domain. Voltage supply 2101 slowly regulates the total conductance of FET 2102 by rising or falling voltage, implemented with handshaking 2103 with the sector buffer driver. The handshaking circuit 2103, shown here, must sense a negative or positive change in voltage to adjust the sector buffer strength to increase or to decrease, respectively.

Figure 22:
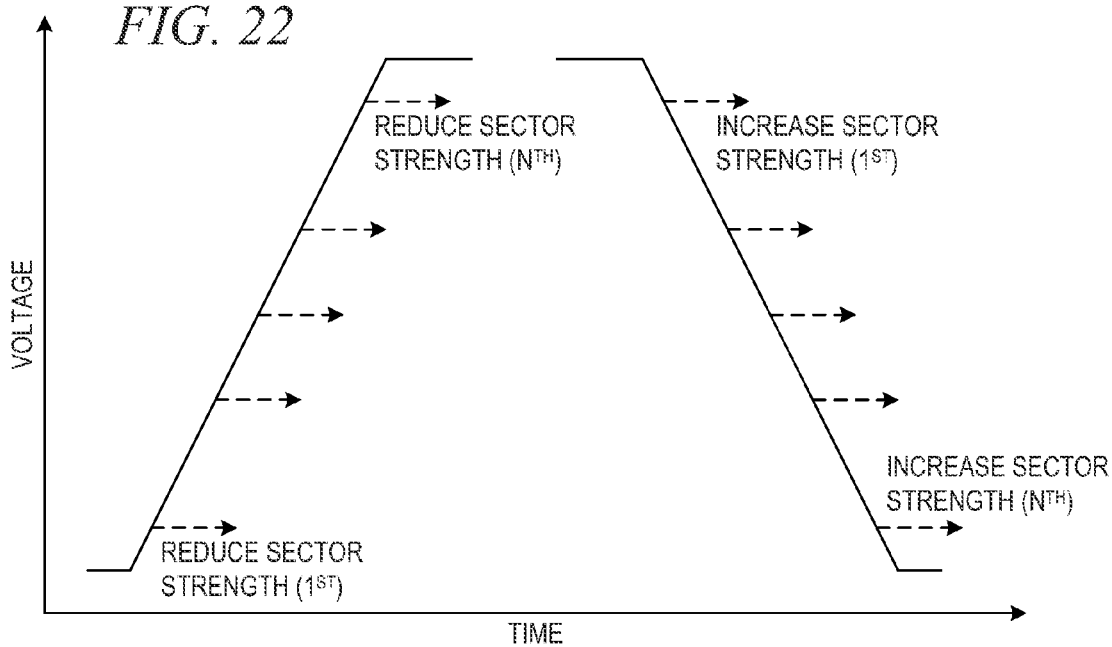
FIG. 22 shows the gradual rise of voltage to switch from non-resonant mode to resonant mode and gradual falling of voltage to switch from resonant mode to non-resonant mode in accordance with an illustrative embodiment.

The voltage ramp tunable resonant switch of FIG. 21 has no logic circuits and, thus, is controlled by a single global control point. FIG. 22 shows the gradual rise of voltage to switch from non-resonant mode to resonant mode and gradual falling of voltage to switch from resonant mode to non-resonant mode in accordance with an illustrative embodiment.

Figure 23:
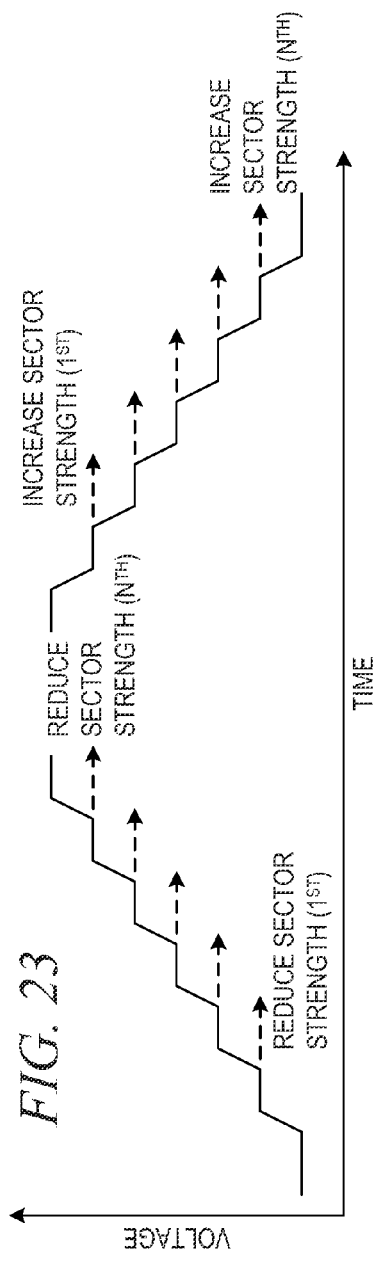
FIG. 23 shows a voltage ramp with plateaus in accordance with an illustrative embodiment.

FIG. 23 shows a voltage ramp with plateaus in accordance with an illustrative embodiment. The voltage ramp may have different step heights, plateau durations, and ramp rates. At none or one or more of these plateaus, handshaking circuits (e.g., 2103) may be invoked to trigger sector buffer strength adjustments. Also, the voltage ramp may have a different number of plateaus moving into resonance than moving out of resonance. For instance, the voltage ramp may have more plateaus and hand shaking (associated with sector buffers) moving into resonance than moving out of resonance because of the requirements on pre-charging the decap to VDD on the way in. Each plateau allows the components to settle before the next step.

Figure 24:
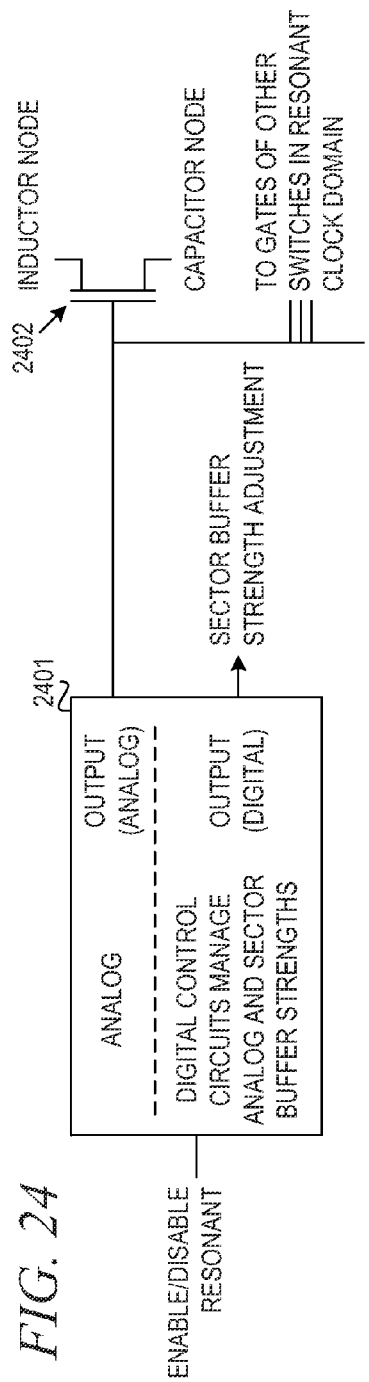
FIG. 24 depicts an analog pump and control resonant switch in accordance with an illustrative embodiment.

FIG. 24 depicts an analog pump and control resonant switch in accordance with an illustrative embodiment. Analog voltage supply 2401 is a pumped circuit that gradually moves output from ground (GND) to $V\_Pump_{max}$ and vice versa. Voltage supply 2401 provides voltage to the gate of FET 2402, as well as the other switches in the resonant clock domain. Voltage supply 2401 slowly regulates the total conductance of FET 2402 by rising or falling voltage delivered to the gate of FET 2402. Digital control circuits may manage the gate voltage of the analog switches and, advantageously, the sector buffer strength adjustments.

Inductors

Figure 25:
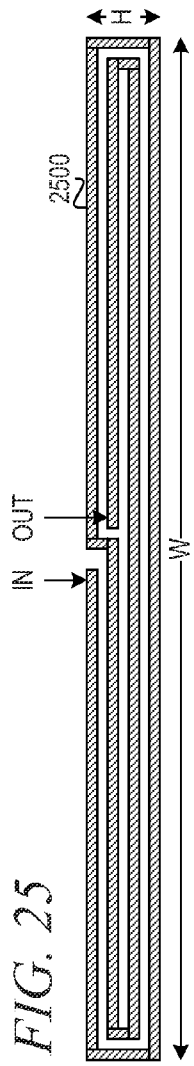
FIG. 25 depicts a long, thin inductor in accordance with an illustrative embodiment.

FIG. 25 depicts a long, thin inductor in accordance with an illustrative embodiment. Inductor 2500 is a very long and thin component formed in a single layer spiral in the metal layer in the depicted example. For example, inductor 2500 may have a 200:1 width to length ratio. Inductor 2500 may be formed in the top layer between signal lines.

In one example embodiment, inductor 2500 is a thick metal inductor in 32 nm silicon technology. The inductor is 1 mm wide by 32 μm tall with an inductance (L) of 2.06 nH/mm, and a quality (Q) of 3.85 at 4 GHz. The inductor is formed with 3.6 μm metal channel width and 1.2 μm space. A single turn of the inductor has an inductance (L) of 0.486 nH/mm with a quality (Q) of 2.30.

The quality factor is reduced compared to a spiral inductor. The cost overhead is much lower than spiral inductors. The current is limited by the electromigration of the wire. The inductor can cross power grid using two metal layers.

Thus, the illustrative embodiments provide mechanisms for wide bandwidth resonant global clock distribution. The illustrative embodiments extend the range of global resonant clock circuits using switchable inductance. The illustrative embodiments provide a programmable, variable resistance switch. The mechanisms of the illustrative embodiments support multiple tuning frequencies. The illustrative embodiments also modify inductors to fit the power grid with minimal disruption. The illustrative embodiments also provide programmable, back end-of-line tunable sector buffers.

The illustrative embodiments widen the effective bandwidth of the resonant clock circuit compared to a single inductor design or a design with inductors that are not switched in and out. The number of resonant modes may be 1 to n depending on the complexity desired and the system requirements. One example embodiment implements two resonant modes. The illustrative embodiments demonstrate a way to widen the bandwidth of a resonant circuit using switches and inductors.

As noted above, it should be appreciated that the illustrative embodiments may take the form of an entirely hardware embodiment, an entirely software embodiment or an embodiment containing both hardware and software elements. In one example embodiment, the mechanisms of the illustrative embodiments are implemented in software or program code, which includes but is not limited to firmware, resident software, microcode, etc.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A wide bandwidth resonant clock distribution comprising:
    a clock grid configured to distribute a clock signal to a plurality of components of an integrated circuit;
    a tunable sector buffer configured to receive the clock signal and provide an output to the clock grid, wherein the tunable sector buffer is programmable to set latency and slew rate of the clock signal;
    at least one inductor;
    at least one tunable resistance switch; and
    a capacitor network,
    wherein the inductor, tunable resistance switch, and capacitor network are connected between the clock grid and a reference voltage; and
    wherein the at least one tunable resistance switch comprises at least one switch and at least one variable resistor and wherein the at least one tunable resistance switch is programmable to dynamically switch the at least one inductor in or out of the clock distribution to effect at least one resonant mode of operation or a non-resonant mode of operation identified based on a frequency of the clock signal.

2. The clock distribution of claim 1, wherein the tunable sector buffer is configured to shape a pulse of clock signal for non-overlap output drive.

3. The clock distribution of claim 1, wherein the at least one tunable resistance switch is switched off to effect the non-resonant mode of operation.

4. The clock distribution of claim 1, wherein the at least one tunable resist switch is switched on to effect a resonant mode of operation.

5. The clock distribution of claim 1, wherein each given tunable resistance switch within the at least one tunable resistance switch comprises a plurality of selectable fingers and is programmable to gradually switch on or off a corresponding one of the at least one inductor to reduce clock disruption by successively enabling the plurality of selectable fingers.

6. The clock distribution of claim 5, wherein the given tunable resistance switch gradually reduces or increases resistance in a plurality of steps by successively enabling the plurality of selectable fingers.

7. The clock distribution of claim 6, wherein step sizes of the plurality of steps are linear or geometric.

8. The clock distribution of claim 1, wherein a given inductor within the at least one inductor is fabricated in one or more metal layers such that it is contained within a rectangular shape with substantially unequal length and width.

9. The clock distribution of claim 8, wherein the given inductor comprises one or more turns of conductor and wherein the length of the rectangular shape is at least two hundred time the width of the rectangular shape.

10. A wide bandwidth resonant clock distribution comprising:
    a clock grid configured to distribute a clock signal to a plurality of components of grated circuit; and
    a plurality of sectors, wherein each sector comprises:
        a tunable sector buffer configured to receive the clock signal and provide an output to the clock grid, wherein the tunable sector buffer is programmable to set latency and slew rate of the clock signal;
        at least one inductor;
        at least one tunable resistance switch; and
        a capacitor network,
        wherein the inductor, tunable resistance switch, and capacitor network are connected between the clock grid and a reference voltage; and
        wherein the at least one tunable switch comprise at least one switch and at least one variable resistor and wherein the at least one tunable resistance switch is programmable to dynamically switch the at least one induct in or out of the clock distribution to effect at least one resonant of opera or a non-resonant mode of operation identified based on a frequency of the clock signal.

11. The clock distribution of claim 10, wherein the tunable sector buffer is configured to shape a pulse of clock signal for non-overlap output drive.

12. The clock distribution of claim 10, wherein each given tunable resistance switch within the at least one tunable resistance switch comprises a plurality of selectable fingers and is programmable to gradually switch on or off a corresponding one of the at least one inductor to reduce clock disruption by successively enabling the plurality of selectable fingers.

13. The clock distribution of claim 10, wherein a given inductor within the at least one inductor is fabricated in one or more metal layers such that it is contained within a rectangular shape with substantially unequal length and width.

14. The clock distribution of claim 13, wherein the at least one inductor comprises one or more turns of conductor and wherein the length of the rectangular shape is at least two hundred times the width of the rectangular shape.

15. A method for wide bandwidth resonant clock distribution, the method comprising:
    identifying a resonant mode or non-resonant mode for an integrated circuit based on a frequency of a clock signal for the integrated circuit, wherein the integrated circuit comprises a plurality of components, a clock grid configured to distribute the clock signal to the plurality of components, a tunable sector buffer configured to receive the clock signal and provide an output to the clock grid, at least one inductor, at least one tunable resistance switch, and a capacitor network, wherein the inductor, tunable resistance switch, and capacitor network are connected between the clock grid and a reference voltage;

configuring the tunable sector buffer to set latency and slew rate of the clock signal; and configuring the at least one tunable resistance switch to dynamically switch the at least one inductor in or out of the clock distribution to effect the identified resonant mode or non-resonant mode, wherein the at least one tunable resistance switch comprises at least one switch and at least one variable resistor.

16. The clock distribution of claim 12, wherein the given tunable resistance switch gradually reduces or increases resistance in a plurality of steps by successively enabling the plurality of selectable fingers.

17. The clock distribution of claim 16, wherein step sizes of the plurality of steps are linear or geometric.

18. The method of claim 15, wherein each given tunable resistance switch within the at least one tunable resistance switch comprises a plurality of selectable fingers and is programmable to gradually switch on or of a corresponding one of the at least one inductor to reduce clock disruption by successively enabling the plurality of selectable fingers.

19. The method of claim 18, wherein the given tunable resistance switch gradually reduces or increases resistance in a plurality of steps by successively enabling the plurality of selectable fingers.

20. The method of claim 15, wherein a given inductor within the at least one inductor is fabricated in one or more metal layers such that it is contained within a rectangular shape with substantially unequal length and width.

* * * * *